US008970639B2

(12) United States Patent
Tu

(10) Patent No.: US 8,970,639 B2
(45) Date of Patent: Mar. 3, 2015

(54) TWO-STAGE DAC ARCHITECTURE FOR LCD SOURCE DRIVER UTILIZING ONE-BIT SERIAL CHARGE REDISTRIBUTION DAC

(75) Inventor: Nang-Ping Tu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 783 days.

(21) Appl. No.: 12/859,893

(22) Filed: Aug. 20, 2010

(65) Prior Publication Data

US 2011/0261086 A1 Oct. 27, 2011

Related U.S. Application Data

(60) Provisional application No. 61/327,147, filed on Apr. 23, 2010.

(51) Int. Cl.
G09G 5/10 (2006.01)
G09G 3/36 (2006.01)
H03M 1/68 (2006.01)
H03M 1/66 (2006.01)
H03M 1/72 (2006.01)
H03M 1/76 (2006.01)
H03M 1/80 (2006.01)

(52) U.S. Cl.
CPC ............ G09G 3/3688 (2013.01); H03M 1/687 (2013.01); G09G 2310/027 (2013.01); H03M 1/72 (2013.01); H03M 1/76 (2013.01); H03M 1/806 (2013.01)
USPC ............................ 345/690; 341/144; 341/146

(58) Field of Classification Search
CPC ............................................ G09G 2320/0276
USPC .............................. 345/87, 690; 341/127–172
See application file for complete search history.

(56) References Cited

U.S. PATENT DOCUMENTS 5,923,311 A * 7/1999 Edwards ......................... 345/92
6,154,162 A 11/2000 Watson et al.
6,628,253 B1 9/2003 Hiroki
6,950,045 B2 9/2005 Kim (Continued)

FOREIGN PATENT DOCUMENTS

CN 101490962 A 7/2009
JP 57-052228 3/1982

(Continued)

OTHER PUBLICATIONS

Moon, U.K. et al., "A Switched-Capacitor DAC With Analog Mismatch Correction", Electronics Letters, Oct. 28, 1999, 35(22):1903-1904.

(Continued)

Primary Examiner — Kent Chang
Assistant Examiner — Chayce Bibbee
(74) Attorney, Agent, or Firm — Duane Morris LLP

(57) ABSTRACT

A two-stage digital-to-analog converter for outputting an analog voltage in response to a M-bit digital input code includes a one-bit serial charge redistribution digital-to-analog converter having a high reference voltage input node for receiving a high reference voltage and a low reference voltage input node for receiving a low reference voltage. A voltage selector sets the high reference voltage and low reference voltage to selected levels depending on at least a portion of the M-bit digital input code.

20 Claims, 24 Drawing Sheets

(56) References Cited

U.S. PATENT DOCUMENTS

| | | |
|---|---|---|
| 7,176,869 B2 | 2/2007 | Kumada et al. |
| 7,649,541 B2 | 1/2010 | Tung et al. |
| 7,663,678 B2 | 2/2010 | Miyasaka |
| 2005/0128113 A1* | 6/2005 | Kyung-Myun .............. 341/138 |
| 2007/0247218 A1 | 10/2007 | Jang et al. |
| 2008/0012843 A1 | 1/2008 | Meno |
| 2008/0030489 A1 | 2/2008 | Kim et al. |
| 2009/0278865 A1 | 11/2009 | Kang et al. |
| 2010/0238146 A1 | 9/2010 | Zebedee |

FOREIGN PATENT DOCUMENTS

| | | |
|---|---|---|
| JP | 03-073616 | 3/1991 |
| JP | 2008-016893 | 1/2008 |
| TW | 200521953 A | 7/2005 |

OTHER PUBLICATIONS

Singh, R.R. et al., "Multi-step Binary-weighted Capacitive Digital-to-Analog Converter Architecture", Circuits and Systems, 2008, MWSCAS 2008, 51st Midwest Symposium, Aug. 10-13, 2008, pp. 470-473.

Kang, J.S. et al., "10-bit Driver IC Using 3-bit DAC Embedded Operational Amplifier for Spatial Optical Modulators (SOMs)", IEEE Journal of Solid State Circuits, Dec. 2007, 42(12):2913-2922.

Notice of Copending Applications.

Official Action issued Apr. 17, 2013 in counterpart CN Patent Application No. 201110096873.3.

* cited by examiner

| Step | S1 | S2 | S3 | dH | dL | Remark |
|---|---|---|---|---|---|---|
| 1 | 0 | 1 | 1 | d0 | 0 | Reset C3 |
| 2 | 1 | 0 | 0 | d0 | 0 | Charge C1, C2 |
| 3 | 0 | 1 | 0 | d2 | d1 | Redistribution |
| 4 | 1 | 0 | 0 | d2 | d1 | Charge C1, C2 |
| 5 | 0 | 1 | 0 | d4 | d3 | Redistribution |
| 6 | 1 | 0 | 0 | d4 | d3 | Charge C1, C2 |
| 7 | 0 | 1 | 0 | d6 | d5 | Redistribution |
| 8 | 1 | 0 | 0 | d6 | d5 | Charge C1, C2 |
| 9 | 0 | 1 | 0 | N/A | N/A | Redistribution |

FIG. 4A

| Step | Output Node Voltage |
|---|---|
| 1 | VL |
| 2 | VL |
| 3 | (2d0+0)/4*(VH-VL)+VL |
| 4 | (2d0+0)/4*(VH-VL)+VL |
| 5 | (2d2+d1+0.5d0)/4*(VH-VL)+VL |
| 6 | (2d2+d1+0.5d0)/4*(VH-VL)+VL |
| 7 | (2d4+d3+(2d2+d1+0.5d0)/4)/4*(VH-VL)+VL |
| 8 | (2d6+d5+(2d4+d3(2d2+d1+0.5d0)/4)/4)/4*(VH-VL)+VL |
| 9 | 1/128(64d6+32d5+16d4+8d3+4d2+2d1+d0)*(VH-VL)+VL |

FIG. 4B

| Step | S1 | S2 | S3 | dH | dL | Remark |
|---|---|---|---|---|---|---|
| 1 | 0 | 1 | 1 | d00 | 0 | Reset C3 |
| 2 | 1 | 0 | 0 | d00 | 0 | Charge C1, C2 |
| 3 | 0 | 1 | 0 | d0 | d01 | Redistribution |
| 4 | 1 | 0 | 0 | d0 | d01 | Charge C1, C2 |
| 5 | 0 | 1 | 0 | d2 | d1 | Redistribution |
| 6 | 1 | 0 | 0 | d2 | d1 | Charge C1, C2 |
| 7 | 0 | 1 | 0 | d4 | d3 | Redistribution |
| 8 | 1 | 0 | 0 | d4 | d3 | Charge C1, C2 |
| 9 | 0 | 1 | 0 | d6 | d5 | Redistribution |
| 10 | 1 | 0 | 0 | d6 | d5 | Charge C1, C2 |
| 11 | 0 | 1 | 0 | N/A | N/A | Redistribution |

FIG. 5A

| Step | S1 | S2 | S3 | dH | dL | Remark |
|---|---|---|---|---|---|---|
| 1 | 0 | 1 | 1 | d01 | d00 | Reset C3 |
| 2 | 1 | 0 | 0 | d01 | d00 | Charge C1, C2 |
| 3 | 0 | 1 | 0 | d0 | d02 | Redistribution |
| 4 | 1 | 0 | 0 | d0 | d02 | Charge C1, C2 |
| 5 | 0 | 1 | 0 | d2 | d1 | Redistribution |
| 6 | 1 | 0 | 0 | d2 | d1 | Charge C1, C2 |
| 7 | 0 | 1 | 0 | d4 | d3 | Redistribution |
| 8 | 1 | 0 | 0 | d4 | d3 | Charge C1, C2 |
| 9 | 0 | 1 | 0 | d6 | d5 | Redistribution |
| 10 | 1 | 0 | 0 | d6 | d5 | Charge C1, C2 |
| 11 | 0 | 1 | 0 | N/A | N/A | Redistribution |

FIG. 6A

| Step | S1 | S2 | S3 | S4 | dH | dL | Remark |
|---|---|---|---|---|---|---|---|
| 1 | 0 | 1 | 1 | 0 | d0 | 0 | Reset C3 |
| 2 | 1 | 0 | 0 | 0 | d0 | 0 | Charge C1, C2 |
| 3 | 0 | 1 | 0 | 0 | d2 | d1 | Redistribution |
| 4 | 1 | 0 | 0 | 0 | d2 | d1 | Charge C1, C2 |
| 5 | 0 | 1 | 0 | 0 | d4 | d3 | Redistribution |
| 6 | 1 | 0 | 0 | 0 | d4 | d3 | Charge C1, C2 |
| 7 | 0 | 1 | 0 | 0 | d6 | d5 | Redistribution |
| 8 | 1 | 0 | 0 | 0 | d6 | d5 | Charge C1, C2 |
| 9 | 0 | 1 | 0 | 0 | N/A | N/A | Redistribution |
| 10 | 0 | 0 | 0 | 1 | N/A | N/A | Offset canceling |

FIG. 7A

| Step | S1 | S2 | S3 | O | dH | dL | Remark |
|---|---|---|---|---|---|---|---|
| 1 | 0 | 1 | 1 | 0 | d00 | 0 | Reset C3 |
| 2 | 1 | 0 | 0 | 0 | d00 | 0 | Charge C1, C2 |
| 3 | 0 | 1 | 0 | 0 | d0 | d01 | Redistribution |
| 4 | 1 | 0 | 0 | 0 | d0 | d01 | Charge C1, C2 |
| 5 | 0 | 1 | 0 | 0 | d2 | d1 | Redistribution |
| 6 | 1 | 0 | 0 | 0 | d2 | d1 | Charge C1, C2 |
| 7 | 0 | 1 | 0 | 0 | d4 | d3 | Redistribution |
| 8 | 1 | 0 | 0 | 0 | d4 | d3 | Charge C1, C2 |
| 9 | 0 | 1 | 0 | 0 | d6 | d5 | Redistribution |
| 10 | 1 | 0 | 0 | 0 | d6 | d5 | Charge C1, C2 |
| 11 | 0 | 0 | 0 | 0 | N/A | N/A | Redistribution |
| 12 | 0 | 0 | 0 | 1 | N/A | N/A | Offset Canceling |

FIG. 8A

| Step | S1 | S2 | S3 | S4 | dH | dL | Remark |
|---|---|---|---|---|---|---|---|
| 1 | 0 | 1 | 1 | 0 | d01 | d00 | Reset C3 |
| 2 | 1 | 0 | 0 | 0 | d01 | d00 | Charge C1, C2 |
| 3 | 0 | 1 | 0 | 0 | d0 | d02 | Redistribution |
| 4 | 1 | 0 | 0 | 0 | d0 | d02 | Charge C1, C2 |
| 5 | 0 | 1 | 0 | 0 | d2 | d1 | Redistribution |
| 6 | 1 | 0 | 0 | 0 | d2 | d1 | Charge C1, C2 |
| 7 | 0 | 1 | 0 | 0 | d4 | d3 | Redistribution |
| 8 | 1 | 0 | 0 | 0 | d4 | d3 | Charge C1, C2 |
| 9 | 0 | 1 | 0 | 0 | d6 | d5 | Redistribution |
| 10 | 1 | 0 | 0 | 0 | d6 | d5 | Charge C1, C2 |
| 11 | 0 | 1 | 0 | 1 | N/A | N/A | Redistribution |
| 12 | 0 | 0 | 0 | 1 | N/A | N/A | Offset Canceling |

FIG. 9A

| Step | S1 | S2 | S3 | dn | Remark |
|---|---|---|---|---|---|
| 1 | 0 | 1 | 1 | d00 | Reset |
| 2 | 1 | 0 | 0 | d00 | Charge |
| 3 | 0 | 1 | 0 | d01 | Redistribution |
| 4 | 1 | 0 | 0 | d01 | Charge |
| 5 | 0 | 1 | 0 | d0 | Redistribution |
| 6 | 1 | 0 | 0 | d0 | Charge |
| 7 | 0 | 1 | 0 | d1 | Redistribution |
| 8 | 1 | 0 | 0 | d1 | Charge |
| 9 | 0 | 1 | 0 | d2 | Redistribution |
| 10 | 1 | 0 | 0 | d2 | Charge |
| 11 | 0 | 1 | 0 | d3 | Redistribution |
| 12 | 1 | 0 | 0 | d3 | Charge |
| 13 | 0 | 1 | 0 | d4 | Redistribution |
| 14 | 1 | 0 | 0 | d4 | Charge |
| 15 | 0 | 1 | 0 | d5 | Redistribution |
| 16 | 1 | 0 | 0 | d5 | Charge |
| 17 | 0 | 1 | 0 | d6 | Redistribution |
| 18 | 1 | 0 | 0 | d6 | Charge |
| 19 | 0 | 1 | 0 | X | Redistribution |

FIG. 13A

| Step | Output Node Voltage |
|---|---|
| 1 | VL |
| 2 | VL |
| 3 | (d00/2)*(VH-VL)+VL |
| 4 | (d00/2)*(VH-VL)+VL |
| 5 | (d01/2+d00/4)*(VH-VL)+VL |
| 6 | (d01/2+d00/4)*(VH-VL)+VL |
| 7 | (d0/2+d01/4+d00/8)*(VH-VL)+VL |
| 8 | (d0/2+d01/4+d00/8)*(VH-VL)+VL |
| 9 | (d1/2+d0/4+d01/8+d00/16)*(VH-VL)+VL |
| 10 | (d1/2+d0/4+d01/8+d00/16)*(VH-VL)+VL |
| 11 | (d2/2+d1/4+d0/8+d01/16+d00/32)*(VH-VL)+VL |
| 12 | (d2/2+d1/4+d0/8+d01/16+d00/32)*(VH-VL)+VL |
| 13 | (d3/2+d2/4+d1/8+d0/16+d01/32+d00/64)*(VH-VL)+VL |
| 14 | (d3/2+d2/4+d1/8+d0/16+d01/32+d00/64)*(VH-VL)+VL |
| 15 | (d4/2+d3/4+d2/8+d1/16+d0/32+d01/64+d00/128)*(VH-VL)+VL |
| 16 | (d4/2+d3/4+d2/8+d1/16+d0/32+d01/64+d00/128)*(VH-VL)+VL |
| 17 | (d5/2+d4/4+d3/8+d2/16+d1/32+d0/64+d01/128+d00/256)*(VH-VL)+VL |
| 18 | (d5/2+d4/4+d3/8+d2/16+d1/32+d0/64+d01/128+d00/256)*(VH-VL)+VL |
| 19 | (d6/2+d5/4+d4/8+d3/16+d2/32+d1/64+d0/128+d01/256+d00/512)*(VH-VL)+VL |

FIG. 13B

| Step | S1 | S2 | S3 | S4 | dn | Remark |
|---|---|---|---|---|---|---|
| 1 | 0 | 1 | 1 | 0 | d00 | Reset |
| 2 | 1 | 0 | 0 | 0 | d00 | Charge |
| 3 | 0 | 1 | 0 | 0 | d01 | Redistribution |
| 4 | 1 | 0 | 0 | 0 | d01 | Charge |
| 5 | 0 | 1 | 0 | 0 | d0 | Redistribution |
| 6 | 1 | 0 | 0 | 0 | d0 | Charge |
| 7 | 0 | 1 | 0 | 0 | d1 | Redistribution |
| 8 | 1 | 0 | 0 | 0 | d1 | Charge |
| 9 | 0 | 1 | 0 | 0 | d2 | Redistribution |
| 10 | 1 | 0 | 0 | 0 | d2 | Charge |
| 11 | 0 | 1 | 0 | 0 | d3 | Redistribution |
| 12 | 1 | 0 | 0 | 0 | d3 | Charge |
| 13 | 0 | 1 | 0 | 0 | d4 | Redistribution |
| 14 | 1 | 0 | 0 | 0 | d4 | Charge |
| 15 | 0 | 1 | 0 | 0 | d5 | Redistribution |
| 16 | 1 | 0 | 0 | 0 | d5 | Charge |
| 17 | 0 | 1 | 0 | 0 | d6 | Redistribution |
| 18 | 1 | 0 | 0 | 0 | d6 | Charge |
| 19 | 0 | 1 | 0 | 0 | X | Redistribution |
| 20 | 1 | 0 | 0 | 1 | X | Offset Canceling |

FIG. 14A

TWO-STAGE DAC ARCHITECTURE FOR LCD SOURCE DRIVER UTILIZING ONE-BIT SERIAL CHARGE REDISTRIBUTION DAC

CROSS REFERENCE TO RELATED APPLICATIONS

This application is a non-provisional of and claims priority to U.S. Provisional Patent Application No. 61/327,147 filed Apr. 23, 2010 and entitled "A New DAC Architecture for LCD Source Driver", the entirety of which is hereby incorporated by reference herein.

FIELD OF THE INVENTION

The present invention relates to liquid crystal display (LCD) source drivers, and more particularly to LCD source drivers utilizing digital-to-analog (DAC) converters.

BACKGROUND OF THE INVENTION

Today's advanced electronics, such as high definition televisions, place ever increasing demands on electronics. For example, customers demand HDTV display systems that can display images with more and more natural colors. Typical LCD drivers for driving pixel arrays of an LCD display use digital-to-analog converters to convert digital codes representing voltage levels to corresponding analog outputs. For example, sixteen binary numbers can be expressed using 4-bits to represent output voltages of the DAC. An actual analog output voltage Vout is proportional to an input binary number, and is expressed as a multiple of the binary number. When the reference voltage Vref of the DAC is a constant, the output voltage Vout has only a discrete value, e.g., one of 16 possible voltage levels, so that the output of the DAC is not truly an analog value. However, the number of possible output values can be increased by increasing the number of bits of input data. A larger number of possible output values in the output range reduces the difference between DAC output values.

It should be apparent that when the DAC input includes a relatively large number of bits, the DAC provides a relatively high-resolution output. However, the circuit area consumed by the DAC increases proportionally with resolution. An increase by only 1 bit in resolution doubles the area of the decoder in the DAC.

An example of a conventional R-type (resistive string) DAC structure used in a LCD source driver is shown in FIG. 1. More specifically, FIG. 1 shows a 6-bit DAC architecture. The DAC structure has a resistive string coupled between reference voltages V0 to V8. A resistor combination, and thus the voltage, is selected based on the 6-bit digital input D0 to D5. An operational amplifier is provided for increasing the driver current. The 6-bit DAC architecture requires 64 resistors, 64 signal lines and one 64×1 decoder. Using this standard architecture to fabricate an 8-bit DAC would require a four times (4×) increase in area, i.e, 256 resistors, 256 signal lines and one 256×1 decoder. Using this standard architecture, to fabricate a 10-bit DAC would require another four times (4×) increase in area, i.e., 1024 resistors, 1024 signal lines and one 1024×1 decoder. Thus, the 10-bit DAC would consume sixteen times as much chip or wafer area than a comparable 6-bit DAC. Traditional DAC architectures take up about 30% of the chip or wafer area. At increased resolutions (e.g., 10-bits and beyond), the size increases needed to achieve these resolutions are unacceptable.

A new DAC architecture for use in high resolution LCD source drivers is desired.

SUMMARY OF THE INVENTION

A two-stage digital-to-analog converter for outputting an analog voltage in response to a M-bit digital input code includes a one-bit serial charge redistribution digital-to-analog converter having a high reference voltage input node for receiving a high reference voltage and a low reference voltage input node for receiving a low reference voltage, a first capacitor coupled between a first capacitor charging node and the low reference voltage input node, a termination capacitor coupled between a charge collection node and the low reference voltage input node, a first switching circuit for selectively coupling the first capacitor charging node to one of the low reference voltage input node and the high reference voltage input node during first capacitor charge cycles in response to instances of a one-bit control code from a sequence of one-bit control codes derived from the M-bit digital input code, and a second switching circuit for coupling the first capacitor charging node to the charge collection node during charge redistribution cycles that follow the first capacitor charge cycles for charge redistribution with the termination capacitor. A voltage selector sets the high reference voltage and low reference voltage to selected levels depending on at least a portion of the M-bit digital input code.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure.

FIG. 4 illustrates a 10-bit DAC architecture in accordance with an embodiment of the present invention and FIG. 4A is a table illustrating the sequential operation of the DAC architecture of FIG. 4.

FIG. 4B is a table listing the output voltage of the DAC architecture after each operation illustrated in FIG. 4A.

FIG. 5 illustrates an alternative embodiment of a 10-bit DAC architecture in accordance with the present invention and FIG. 5A is a table illustrating the sequential operation of the DAC architecture of FIG. 5.

FIG. 6 illustrates another alternative embodiment of a 10-bit DAC architecture in accordance with the present invention and FIG. 6A is a table illustrating the sequential operation of the DAC architecture of FIG. 6.

FIG. 7 illustrates an embodiment of the 10-bit DAC architecture of FIG. 4 with built-in offset cancelation and FIG. 7A is a table illustrating the sequential operation of the DAC architecture of FIG. 7.

FIG. 8 illustrates an embodiment of the 10-bit DAC architecture of FIG. 5 with built-in offset cancelation and FIG. 8A is a table illustrating the sequential operation of the DAC architecture of FIG. 8.

FIG. 9 illustrates an embodiment of the 10-bit DAC architecture of FIG. 6 with built-in offset cancelation and FIG. 9A is a table illustrating the sequential operation of the DAC architecture of FIG. 9.

FIG. 13 illustrates an embodiment of a 10-bit DAC architecture utilizing a 1-bit serial charge redistribution DAC and FIG. 13A is a table illustrating the sequential operation of the DAC architecture of FIG. 13.

FIG. 13B is a table listing the output voltage of the DAC architecture after each operation illustrated in FIG. 13A.

FIG. 14 illustrates an embodiment of the 10-bit DAC architecture of FIG. 13 with built-in offset cancelation and FIG. 14A is a table illustrating the sequential operation of the DAC architecture of FIG. 14.

DETAILED DESCRIPTION

This description of the exemplary embodiments is intended to be read in connection with the accompanying drawings, which are to be considered part of the entire written description. Terms concerning electrical attachments, coupling and the like, such as "connected" and "interconnected," refer to a relationship wherein structures communicate with one another either directly or indirectly through intervening structures, unless expressly described otherwise.

Active-matrix-type liquid crystal displays (hereinafter, will be referred to as LCDs) are known in the art and described in, for example, U.S. Pat. No. 7,176,869 to Kumada et al., the entirety of which is hereby incorporated by reference herein. The LCD has a gate driver as a scan signal driver for supplying scan signals in a pixel selection period, a source driver as a data signal driver for supplying data signals to a liquid crystal panel, and a control circuit for controlling timings for the gate driver and the source driver. These components, except for the improvements to the source driver described herein, are known in the art and need not be described in detail herein.

In the liquid crystal display, graphic data is transmitted from the control circuit to the source driver where the graphic data signal is converted from digital to analog and supplied to the liquid crystal panel as its drive voltage. A reference voltage generator circuit connected to the source driver produces a voltage that serves as a reference in the D-to-A conversion of the graphic data signal.

Figure 1:
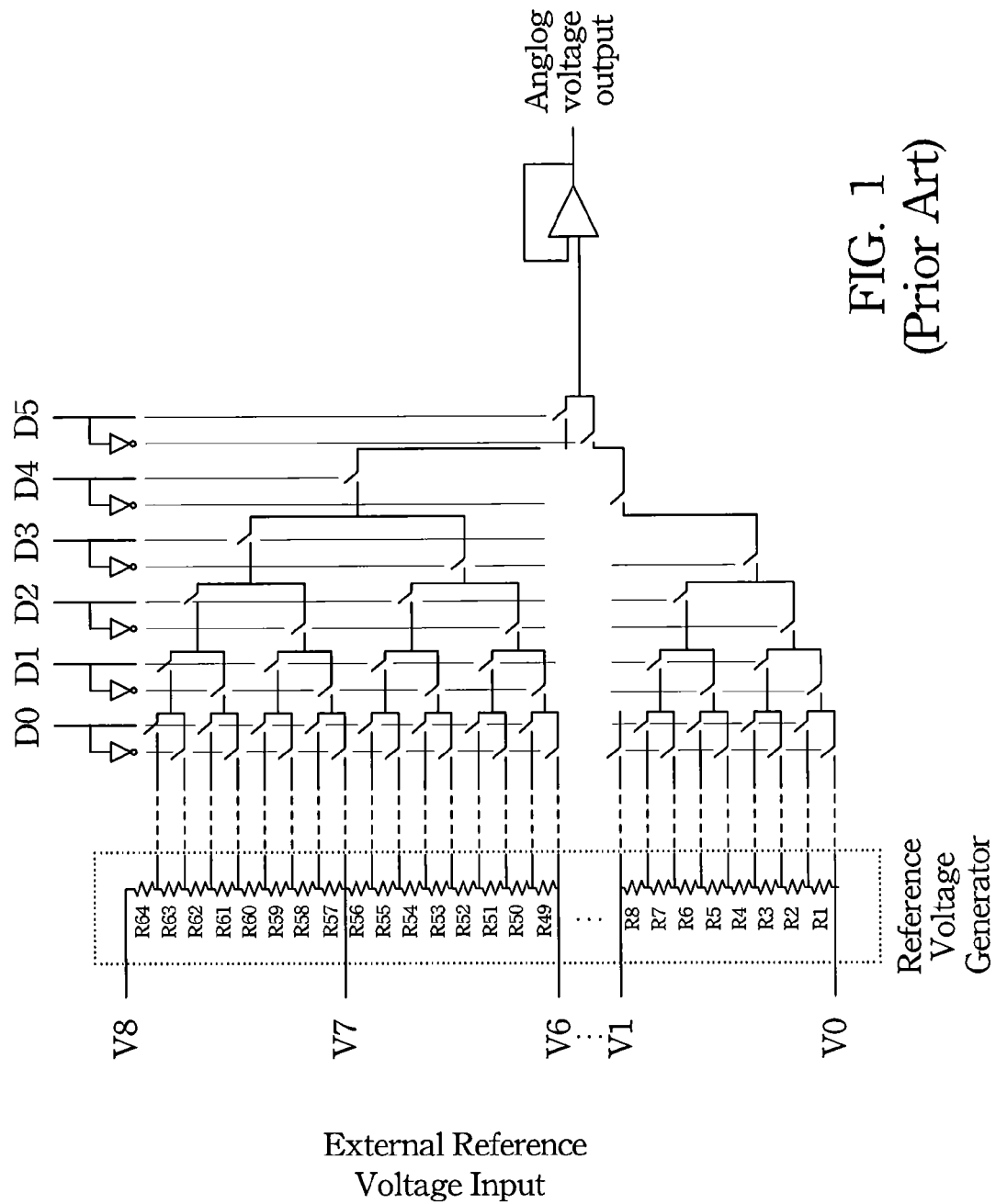
FIG. 1 is a circuit diagram of a source driver using a prior art resistive string DAC architecture having 6-bit resolution.
Figure 2:
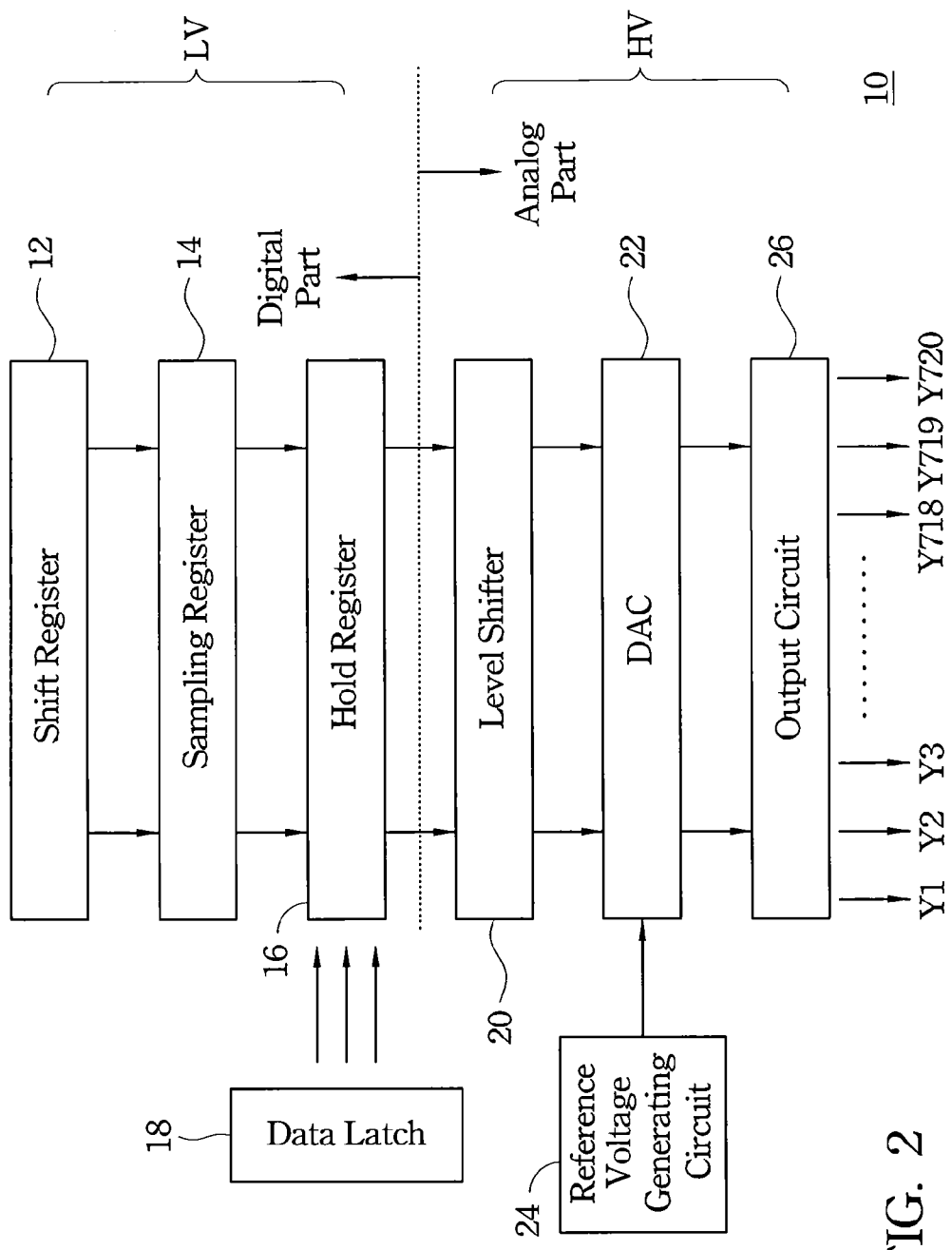
FIG. 2 is illustrates a conventional design for a LCD source driver and FIG. 3 illustrates in more detail the DAC element of the LCD source driver of FIG. 2.
Figure 3:
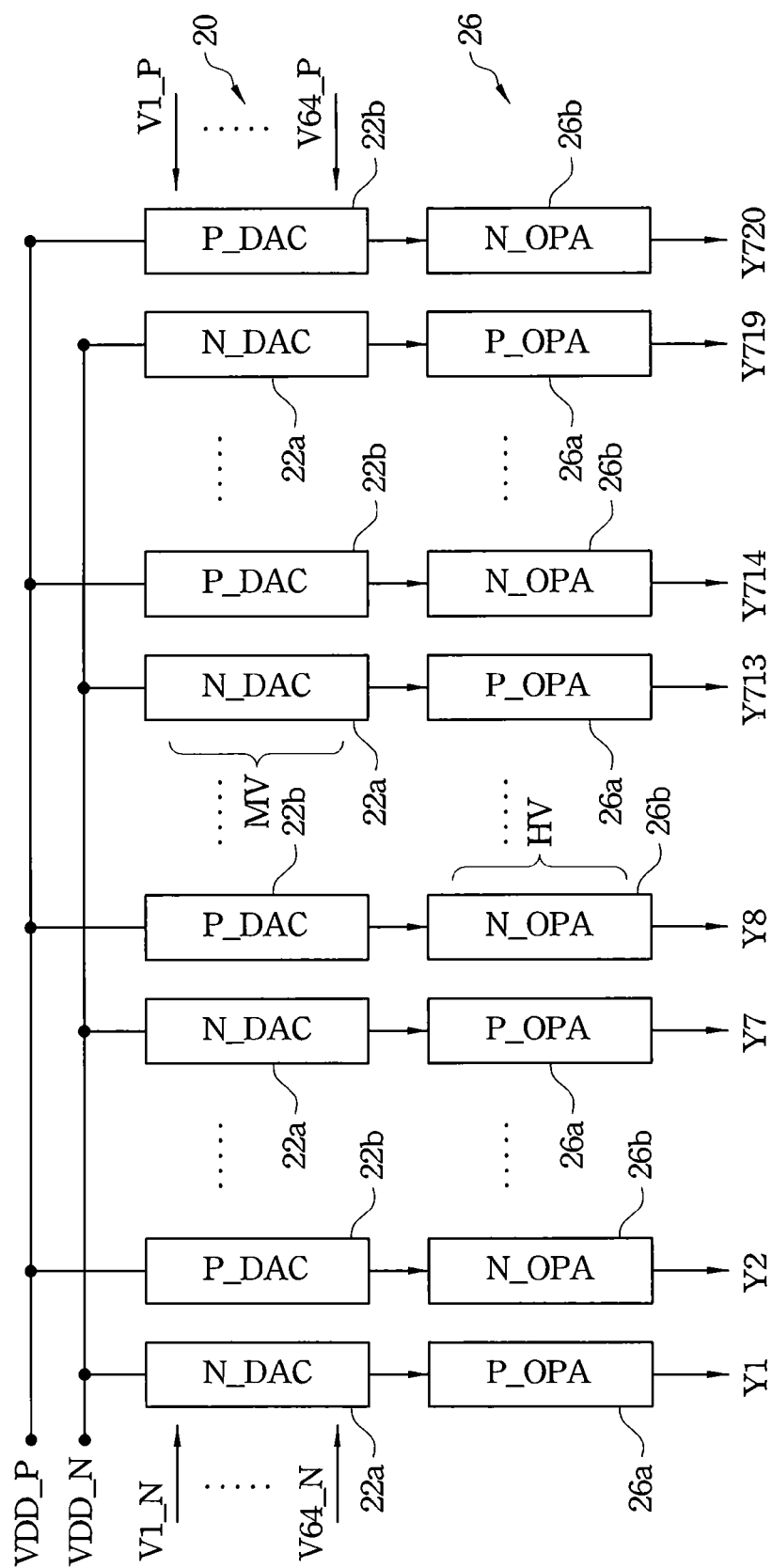

FIG. 2 is a schematic illustration of a conventional LCD source driver 10. The source driver 10 includes a digital part implemented in a low voltage (LV) technology. This part includes a shift register 12, a sampling register 14, a hold register 16 and a data latch 18. The analog part, which is implemented in a higher voltage or voltages, includes a level shifter 20, a DAC 22, a reference voltage generator 24 and an output circuit 26, which may include operational amplifiers as shown in FIG. 3. The output of the driver 10 is shown as having 720 analog outputs Y1 to Y720, one each for each line of an LCD display.

FIG. 3 is a more detailed schematic illustration of the DAC 22 and one form of output circuit 26 of the of the source line driver 10 of FIG. 2. The DAC and output circuit architecture are typically constructed as a differential architecture, including alternating NMOS and PMOS based DAC structures 22a, 22b, respectively, and PMOS and NMOS input operational amplifiers 26a, 26b, respectively. However, rather than a differential architecture, those familiar with such designs will understand that a rail-to-rail operational amplifier output circuit architecture may be used. There may be several drivers in a LCD display. For example, for HDTV 1920×1080, there may be 8 drivers in the display (1920×3(RGB)/720). The operations of the LCD source driver and its components illustrated in FIGS. 2 and 3 are familiar to those of ordinary skill in this art. As such, a detailed description of these components is not needed and is not provided so as to avoid obscuring the description of the present invention, which relates to improved DAC architectures for use in such LCD drivers.

The improved DAC architecture illustrated herein breaks the DAC functionality into two stages. A first stage provides a coarse output voltage range corresponding roughly to an M-bit digital input code, and a second stage uses a two-bit serial charge redistribution DAC to provide the finer target voltage within the coarse range. Gamma correction and offset cancellation can be built into the DAC architecture. As will be apparent from the following description, the DAC architecture can provide significant area savings for high speed, large panel, high resolution designs.

Figure 4:
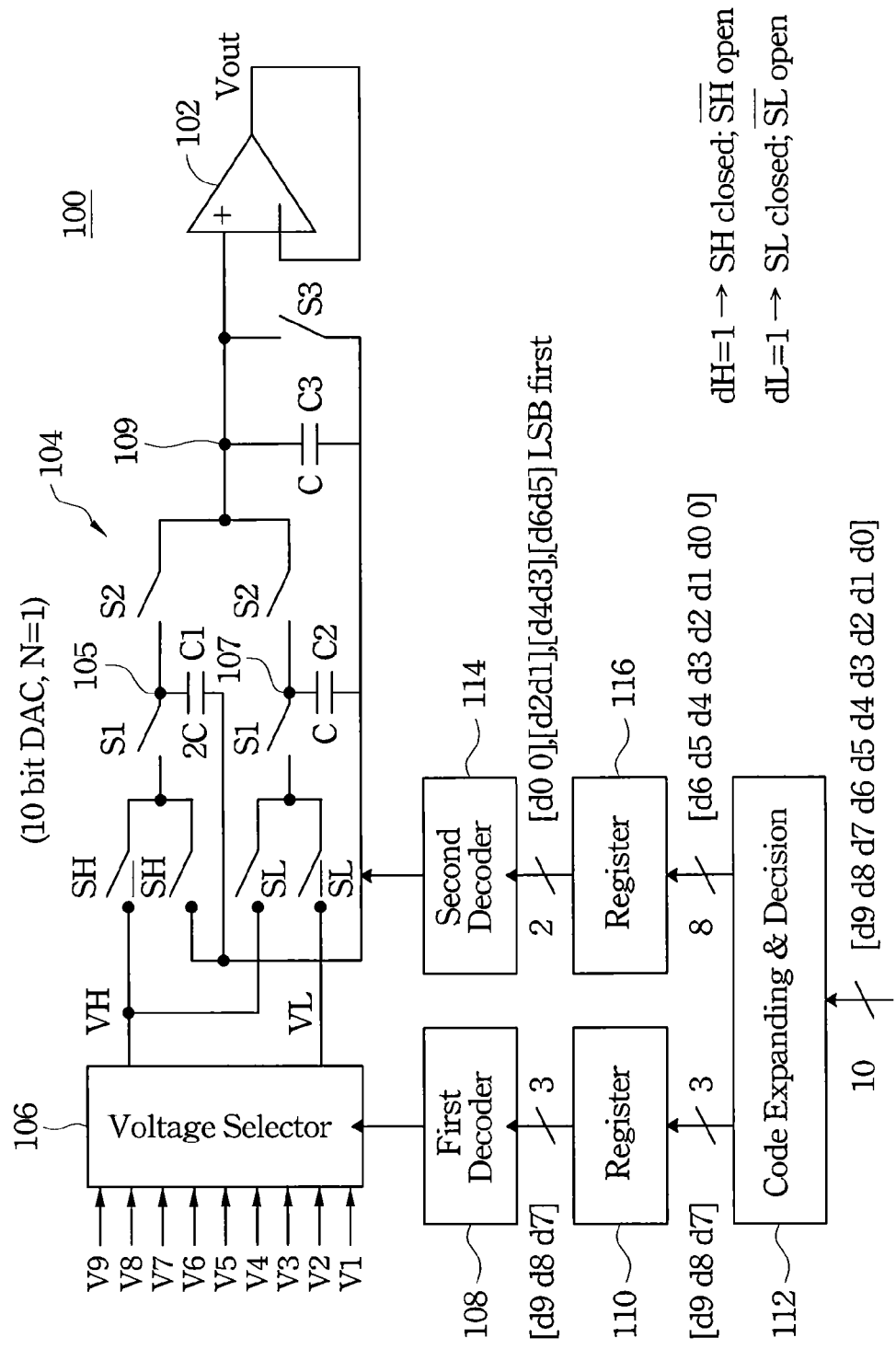

FIG. 4 illustrates a first embodiment of a high resolution DAC architecture 100, and FIG. 4A illustrates the operational steps performed by the DAC in producing an analog voltage Vout from a M-bit digital input code. More specifically, FIG. 4 illustrates an embodiment of a 10-bit DAC architecture 100. While a 10-bit embodiment is illustrated, it should be understood that the general principles illustrated by the 10-bit embodiment apply equally to DAC architectures of higher resolutions (e.g., 11-bit and higher designs) and even to those of lower resolution (9-bit and lower designs) if desired to implement as such.

The 10-bit DAC architecture 100 includes an output operational amplifier 102, which is provided for current gain purposes. The output of the operational amplifier 102 (Vout) is fed back to the negative input of the operational amplifier 102. The positive input of the operational amplifier 102 is coupled to the output of a serial charge-redistribution DAC 104, specifically a 2-bit serial charge redistribution DAC, which is discussed in more detail below. The serial charge-redistribution DAC 104 has high reference voltage and low reference voltage inputs for receiving a pair of reference voltages VH and VL, which define a course voltage range. Voltage selector circuit 106 provides reference voltages VH and VL, which in the illustrated embodiment are an adjacent voltage pair selected by the voltage selector 106 from a plurality of adjacent voltage pairs spanning references voltages V1 to V9. A 10-bit input code ranging from least significant bit (LSB) d0 to most significant bit (MSB) d9 is provided to Code Expanding & Decision logic 112. Assuming voltage selector 106 selects amongst Y adjacent pairs of voltages, the Code Expanding & Decision logic 112 extracts the $\log_2 Y$—most significant bits from the 10-bit input code. For example, if there are eight voltage pairs from V1 to V9 in the embodiment of FIG. 4 (i.e. V1/V2, V2/V3, V3/V4, V4/V5, V5/V6, V6/V7, V7/V8 and V8/V9), then the Code Expanding & Decision logic 112 extracts the three most significant bits (d9, d8, d7) from the 10-bit input code for use in selecting an adjacent pair of voltages. The Code Expanding & Decision logic 112 provides those three bits to temporary storage, such as to a register 110. The three most significant bits are provided to a first decoder 108 for decoding into a control signal for controlling the voltage selector 106 to output one of eight possible VL and VH pairs corresponding to the three bit input code to the decoder 108. For example, if the [d9 d8 d7] is [1 1 1], then the VL/VH pair is V8/V9, and if [d9 d8 d7] is [0 0 0], then the VL/VH pair is V1/V2. With the coarse voltage range represented by VL and VH, the two-bit serial charge-redistribution DAC 104 is used to output the specific voltage level within the range of VL to VH corresponding to the 10-bit input code, as discussed below.

FIG. 4 illustrates an embodiment described as an N=1 embodiment. That is, the Code Expanding & Decision logic expands the 10-bit digital input code by 1 bit. In the illustrated embodiment, the expansion bit is used as a filler or padding bit after the least significant bit of the 10-bit digital input code. This bit is set to a default of "0". The seven least significant bits (d6 to d0) and the one filler or padding bit, for a total of eight bits, are provided from Code Expanding & Decision logic 112 to second register 116. An N=0 embodiment is contemplated when the number of least significant bits provided by Code Expanding & Decision logic 112 is an even number, e.g., 8-bits in an 11-bit digital input code embodiment. Where the filler bit is always set to 0, no gamma correction (discussed below) is implemented via the Code Expanding & Decision logic provided by the 10-bit architecture. In an N=1 embodiment with gamma correction, the expansion bit could be dynamically set to either "0" or "1" by the logic 112.

This 8-bit code (d6 d5 d4 d3 d2 d1 d0 0) is provided to temporary storage register 116. Register 116 is controlled to sequentially/serially provides the stored 8-bit code to the second decoder 114 in a sequence of two bit combinations [dH dL], starting from the least significant bits of the eight bit code, i.e., combination [d0 0] first, then combination [d2 d1] second, then combination [d4 d3] third and finally combination [d6 d5] last. These code combinations are used by the second decoder 114 to control the two-bit serial charge redistribution DAC 104.

Two-bit serial charge-redistribution DAC 104 operates to select a voltage within the range of VL to VH for output to the operational amplifier 102. The charge-redistribution DAC 104 includes a termination capacitor C3 connected between the low reference voltage node and a charge collection node 109 coupled to the positive input of the operational amplifier 102 and a pair of binary weighted capacitors C1, C2, each having a first end also coupled to the low reference voltage node and second ends coupled to first capacitor charging node 105 and second capacitor charging node 107, respectively. The second end of capacitor C1 is selectively coupled to either the low reference voltage VL or the high reference voltage VH during a charging cycle via a first switching circuit, which includes a switch S1 and a pair of complementary switches SH, SH bar. A second end of capacitor C2 is selectively coupled to either the low reference voltage VL or the high reference voltage VH during a charging cycle via a second switching circuit, which also includes a switch S1 and a pair of complementary switches SL, SL bar. Complementary switches SH, SH bar and complementary switches SL, SL bar are controlled by the output of the second decoder 114.

The first capacitor charging node 105 is coupled to the charge collection node 109 via a switch S2 during a charge redistribution cycle, and the second capacitor charging node 107 is coupled to the charge collection node 109 via a second switch S2 during the charge redistribution cycle. A switch S3 is coupled between the low reference voltage node and the charge collection node 109 for purpose of resetting the capacitor voltages during a reset operation. Switches S1, S2 and S3 can be controlled in any number of ways, such as by clock signals issued by a clock controller.

For an individual two bit combination [dH dL], when dH is a "1" then the switch SH is closed and the switch SH bar is open, and when dH is a "0" then the switch SH is open and the switch SH bar is closed. Similarly, when dL is a "1" then the switch SL is closed and the switch SL bar is open, and when dL is a "0" then the switch SL is open and the switch SL bar is closed.

Capacitors C2 and C3 have capacitance value C and capacitor C2 has capacitor value 2 C. As should be apparent, the charge within a capacitor is a multiple of the capacitance of the capacitor. So, assuming for example that both C1 and C2 are charged at the same time, the charge within capacitor C1 will be twice that of the charge within C2.

The operation of the serial charge-redistribution DAC 104 is illustrated with the aid of FIG. 4A.

At Step 1, switches S1 are open and switches S2 and S3 are both closed. This step resets the voltage across capacitors C1, C2 and C3 to 0V, as both electrodes of each capacitor are coupled to voltage VL. After step 1, switch S3 is opened and left open until the routine is run again and a reset of capacitor C3 is required.

At Step 2, switches S1 are closed and switches S2 are open for purposes of charging capacitors C1 and C2. The first 2-bit combination [dH dL], i.e., [d0 0] provided by the register 116, is used by the second decoder 114 to control switches SH, SH bar, SL and SL bar. If dH is "1", then SH is closed, SH bar is open and capacitor C1 is coupled between VH and VL for charging. If dH is "0", then SH is open, SH bar is closed and capacitor C1 is coupled VL and VL and not charged. If dL is "1", then SL is closed, SL bar is open and capacitor C2 is coupled between VH and VL for charging. If dL is "0", then SL is open, SL bar is closed and capacitor C2 is coupled between VL and VL, meaning it is not charged.

At Step 3, switches S1 are open and switches S2 are closed for purposes of distributing any charge built-up in capacitors C1 and C2, and any residual charge in capacitor C3 (which is none at this point), between capacitors C1, C2 and termination/collection capacitor C3. Specifically, closing switches S2 connects capacitors C1, C2 and C3 together in parallel between charge collection node 109 and the low reference voltage node. The total charge in the circuit is distributed such that the charge in each capacitor is proportional to its capacitance. That is, capacitor C1 has half the total charge ($Q_{total}$) and each of capacitors C1 and C3 have one-quarter of the total charge, since total capacitance is 4 C. The charge distributed to capacitor C3 results in a voltage at the output node equal to VL+$V_{C3}$. The voltage $V_{C3}$ is equal to ($Q_{total}$)/4C. During each charge distribution phase/cycle, there is a distribution to capacitor C3 of ¼ of the total charge in the circuit. After this step, the output node voltage is equal to (2d0+0)/4*(VH−VL)+VL. At this step, the register 116 also loads the next 2-bit combination [d2 d1] to the second decoder 114 in preparation for the next capacitor charge phase/cycle.

Step 4 operates in the same manner as step 2 only with switches SH, SH bar, SL and SL bar under control of the second instance of the sequential 2-bit code, i.e., combination [d2 d1]. Depending on the values of [d2 d1], step 4 can add charge to the charge already existing in capacitors C1 and C2. At step 5, capacitors C1, C1 and C3 are again connected in parallel between the low reference voltage node and node 109. The total charge $Q_{total}$ in the circuit includes the residual charges in capacitor C3 (at the end of step 3) plus the total charge in capacitors C1 and C2 (i.e., the residual charge at the end of step 3 in these capacitors plus any charge added to those capacitors in step 4). The total charge $Q_{total}$ is again redistributed across the three capacitors in proportionate shares. This results in a residue voltage division by a factor of 4 in capacitor C3. The voltage at the output node is again equal to VL+$V_{C3}$. After step 5, VL+$V_{C3}$ is equal to the total charge in capacitor C3 divided by the total combined capacitance 4 C of the capacitors C1/C2/C3. After step 5, the output node voltage is equal to: (2d2+d1+0.5d0)/4*(VH−VL)+VL.

The operation of Steps 6-9 should be apparent from the foregoing description of steps 2-5. The resulting voltage at the node 109 for each stage is shown in FIG. 4B. As shown in FIG. 4B, the voltage at the output node at this time is 1/128 (64d6+32d5+16d4+8d3+4d2+2d1+d0)*(VH−VL)+VL.
That is, the voltage could be anywhere from VL (if all eight bits of the code provided to register 116 are "0") to VL+127/128 (VH−VL) (if the seven most significant bits of the code provided to register 116 are "1" and the filler bit is 0).

The output voltage provided by the two-bit serial charge redistribution DAC architecture conforms to the following summation formula, where "n" and "i" represent differential variables and where when i=1 then di represents d1, if i=2, then di represents d2, etc.

$$V_L + (V_H - V_L) * \sum_{i=0}^{n} (2^i di) * 2^{-(n+1)}.$$

While the serial charge redistribution DAC architecture is described herein as being a 2-bit serial charge redistribution DAC, it should be understood that the architecture can be upwardly scaled as needed to accommodate higher order resolutions. For example, a 3-bit serial charge redistribution DAC could have an additional binary weighted capacitor of capacitance 4 C coupled in the same manner as capacitors C1 and C2 and controlled by a separate switching circuit. The decoder 114 would be configured as a three-bit decoder and register 116 would provide three bit combinations rather than two-bit combinations.

Figure 5:
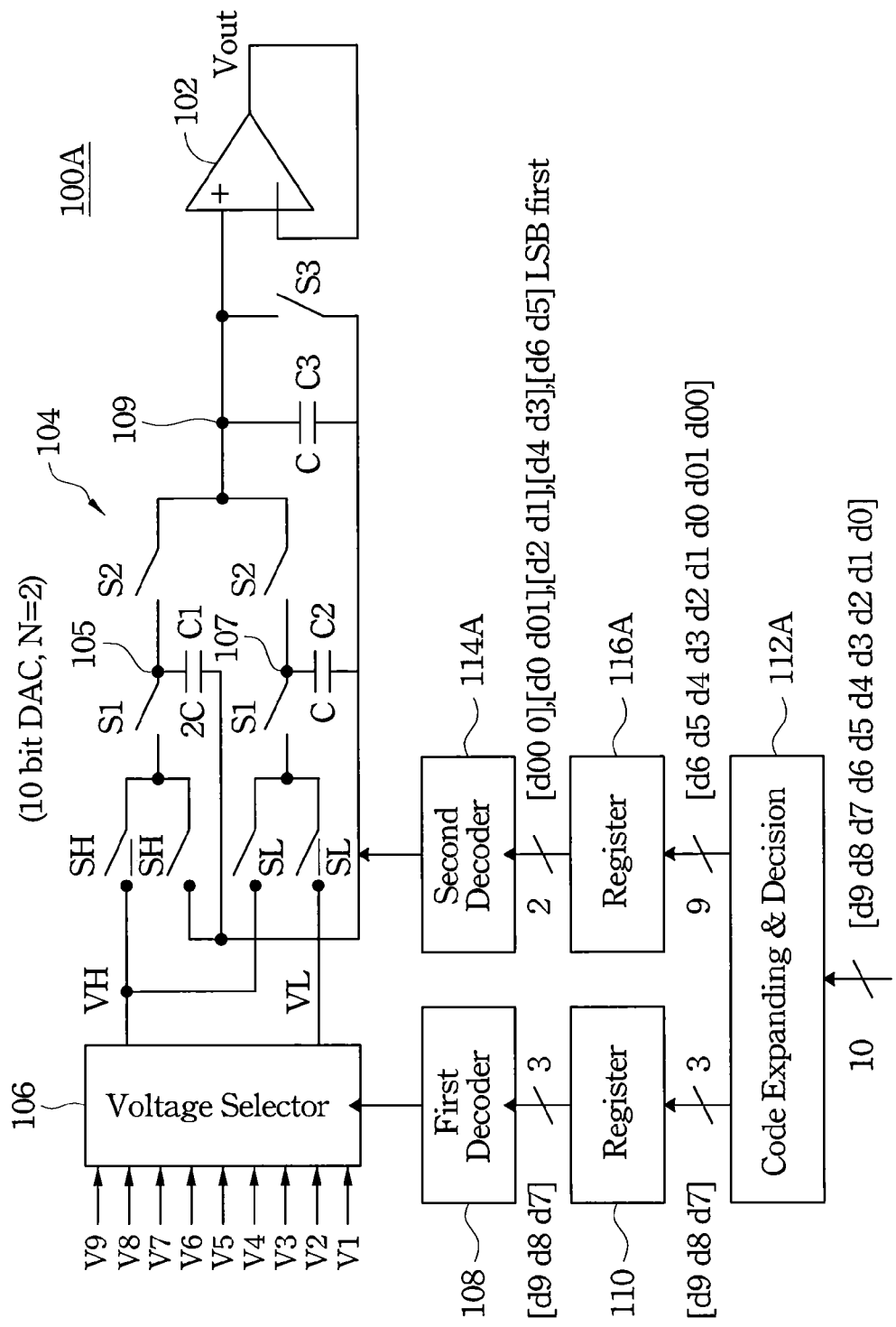

FIGS. 5 and 5A illustrate an alternative DAC architecture 100A and the sequential operation thereof, respectively. The architecture 100A is identical in all respects to architecture 100 except that N=2. That is, the remaining seven least significant bits of the 10-bit input code are expanded to nine bits by the addition of two (N=2) extra bits d00 and d01. Code Expanding and Decision logic 112A determines the value of these two bits, as described in more detail below, and provides the seven bits d6 to d0 from the original input code with these two additional bits d00 and d01 to the register 116A. Register 116A then provides to second decoder 114A 2-bit combinations derived from the 9-bit code provided by the Code Expanding & Decision logic 112A sequentially and in two-bit combinations [dH dL], least significant bits first, in the manner described above in connection with FIG. 4 for control of switches SH, SH bar, SL and SL bar. That is, register 116A first provides [d00 0], with the "0" in the dL location being a filler bit; then [d0 d01]; then [d2 d1]; then [d4 d3]; and finally [d6 d5].

The charge redistribution circuit 104 of FIG. 5 is structurally the same as the corresponding circuit from FIG. 4. The only operational difference is the addition of extra charge and redistribution Steps 10 and 11 as shown in FIG. 5A and the respective bit combinations used at the individual steps, i.e., FIG. 5A begins with the [dH dL] bit combination [d00 0] rather than [d0 0] as in FIG. 4A.

Figure 6:
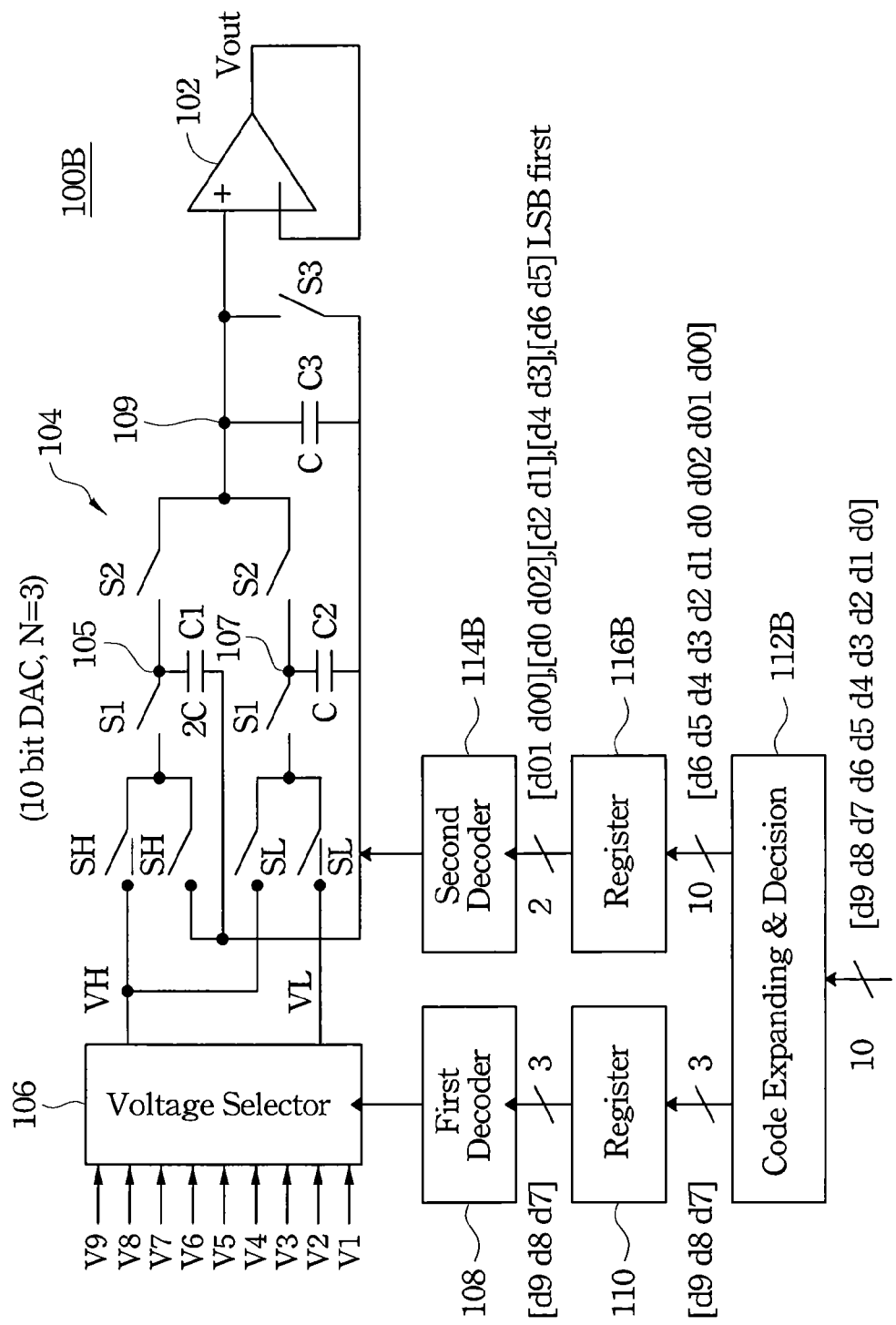

FIGS. 6 and 6A illustrate an alternative DAC architecture 100B and the sequential operation thereof, respectively. The architecture 100B is identical in all respects to the architectures 100 and 100A except that N=3. That is, the remaining seven least significant bits of the 10-bit input code are expanded to ten bits by the addition of three (N=3) extra bits d00, d01 and d02. Code Expanding and Decision logic 112B determines the value of these three bits, as described in more detail below, and provides the seven bits d6 to d0 from the original 10-bit input code with these three additional bits d00, d01 and d02 to the register 116B. Register 116B then provides to second decoder 114B 2-bit combinations derived from the 10-bit code provided by the Code Expanding & Decision logic 112B sequentially and in two-bit combinations [dH dL], least significant bits first, in the manner described above in connection with FIGS. 4 and 5 for control of switches SH, SH bar, SL and SL bar. That is, register 116B first provides [d01 d00]; then [d0 d02]; then [d2 d1]; then [d4 d3]; and finally [d6 d5]. Note that there is no need for a filler bit "0" in this embodiment.

The charge redistribution circuit 104 of FIG. 6 is structurally the same as the corresponding circuits from FIGS. 4 and 5. The only operational difference from the steps illustrated in FIG. 5A is found in steps 1 to 4, which use the first two 2-bit codes of FIG. 6 rather than those of FIG. 5.

Figure 7:
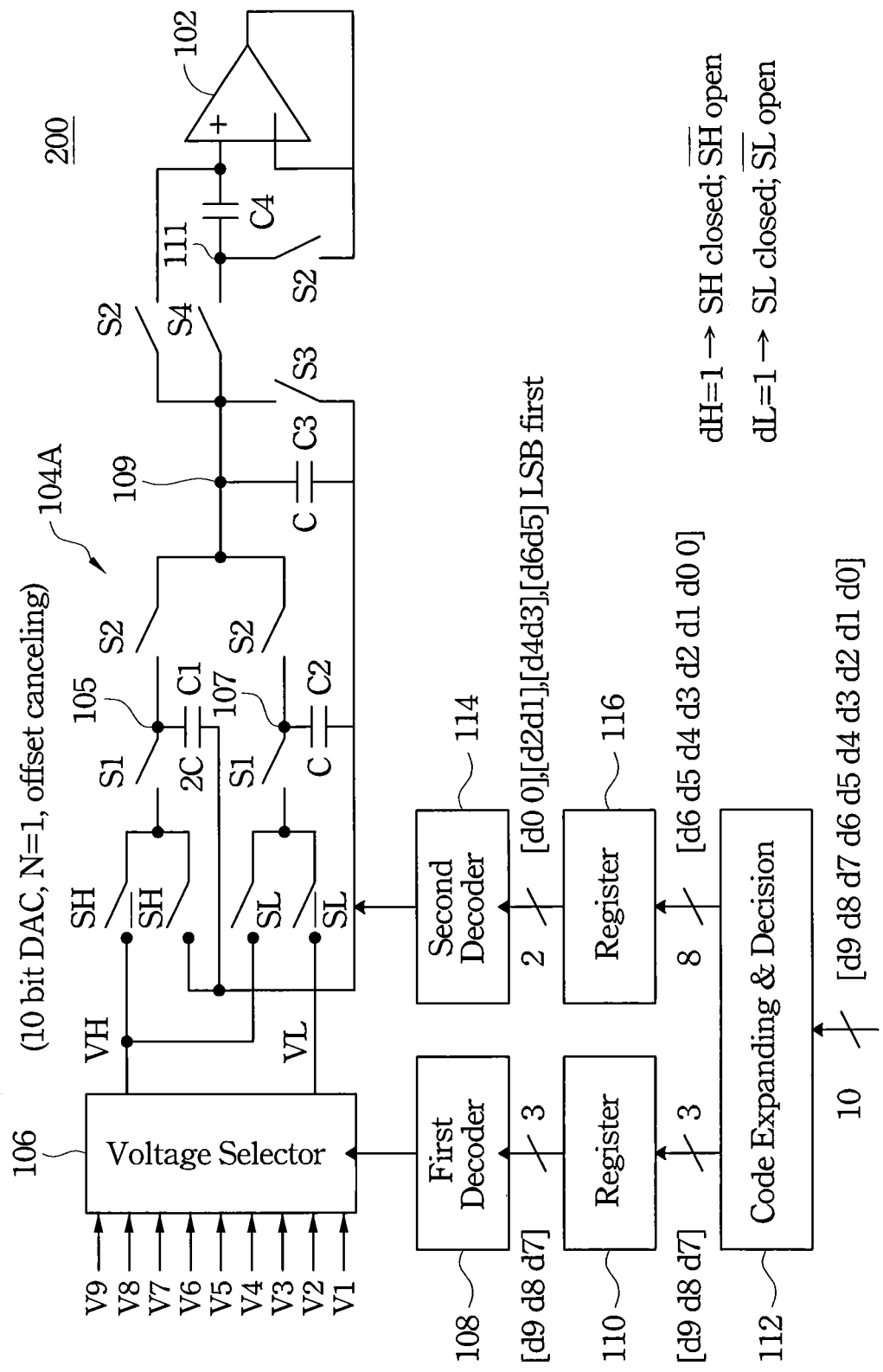
Figure 8:
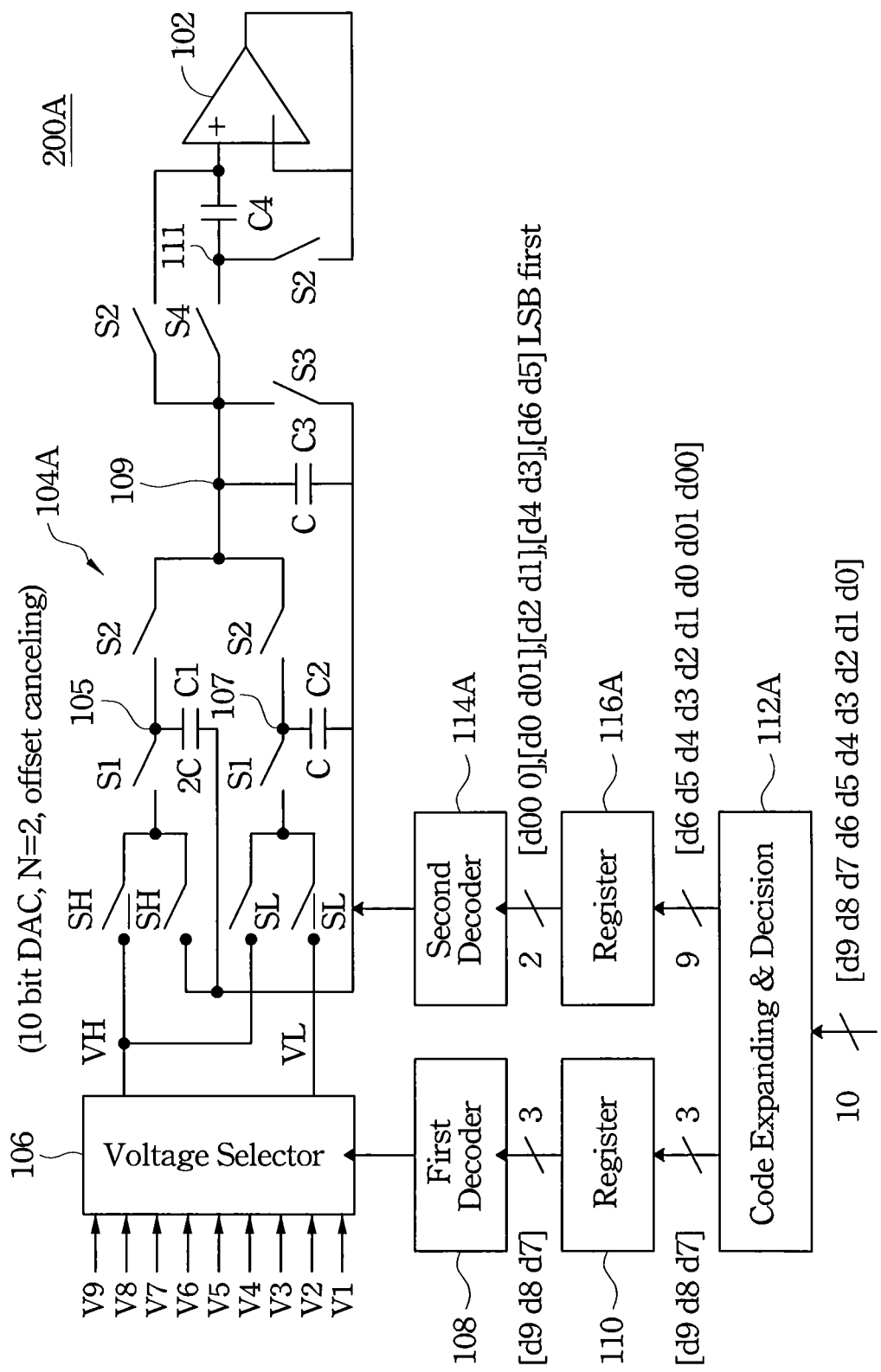
Figure 9:
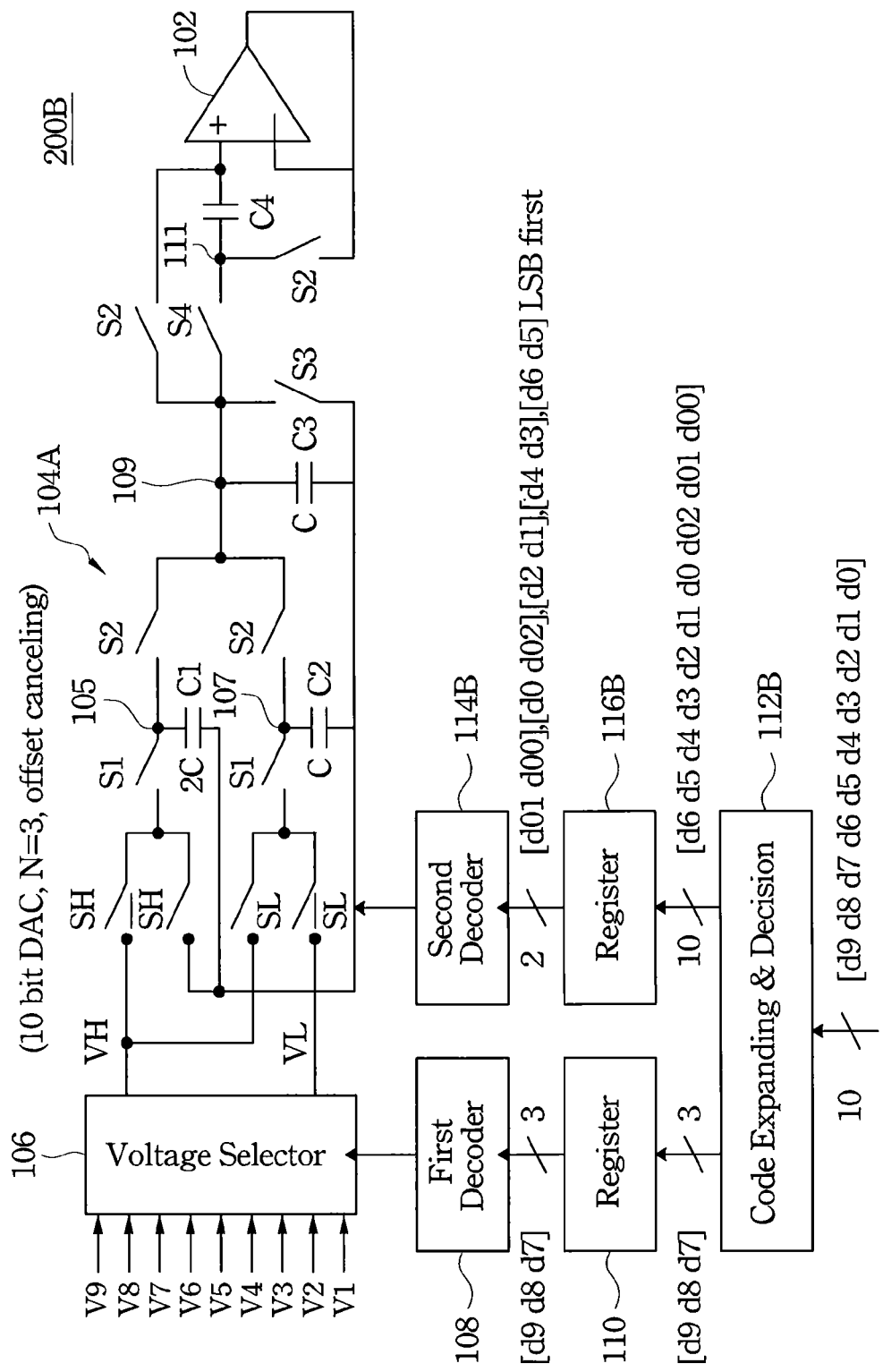

FIG. 7-9 illustrate embodiments of the DAC architectures illustrated in FIGS. 4-6 but modified to provide offset compensation. The modified operation of these architectures are illustrated in connection with FIGS. 7A, 8A and 9A, respectively. Unless described otherwise, the structure and operations of these DAC architectures are identical to those of FIGS. 4 to 6 and 4A to 6A, respectively.

FIG. 7 shows a DAC architecture 200 and FIG. 7A shows sequential steps illustrating the operation of the DAC architecture of FIG. 7. The DAC architecture 200 is identical to the DAC architecture 100 of FIG. 4 except for charge redistribution circuit 104A. Compared to charge redistribution circuit 104, charge redistribution circuit 104A includes: an additional switch S2 coupled between node 109 and the positive input of the operational amplifier 102; an additional switch S2 coupled between the output of the operational amplifier 102 and a node 111; a switch S4 coupled between nodes 109 and 111; and a fourth capacitor C4 coupled between node 111 and the positive input of the operational amplifier 102. These additional components operate to compensate for any offset voltage that may be inherent in the operational amplifier 102.

Referring now to FIG. 7A, steps 1-9 of FIG. 7A are identical to those described above in connection with FIG. 4A. That is, steps 1-9 are performed to charge capacitor C3 to a desired voltage, which is added to the lower voltage VL. This voltage (VL+$V_{C3}$) is the voltage at node 109 in FIG. 7 after step 9 is performed. It should be noted that for steps 1-9 switch S4 is open, meaning capacitor C4 is not connected to node 109. Added third and fourth switches S2 are open during steps 2, 4, 6 and 8. This disconnects capacitor C4 from the circuit when capacitors C1 and C2 are charging. However, during the redistribution steps 3, 5, 7 and 9, these additional switches S2 are triggered, which couples node 109 to the positive input of operational amplifier and creates a feedback path from the output of the operational amplifier 102 into the positive input of the operational amplifier 102 through capacitor C4. This connection stores the offset voltage (Vos) of the operational amplifier 102 into the capacitor C4. At this step, the output voltage from the operational amplifier 102 is equal to the voltage at node 109 minus the offset voltage (Vos) of the operational amplifier 102. FIG. 7A illustrates an additional step S10 is performed after capacitor C3 is fully charged (Step 9). Step 10 is an offset cancelation step. At step 10, only switch S4 is triggered, which connects node 109 to the positive input of the operational amplifier 102 through node 111 and capacitor C4. As noted, the voltage across capacitor C4 represents the offset voltage (Vos) of the operational amplifier 102. This offset voltage is added to the voltage at node 109 to compensate for the offset provided by operational amplifier 102. As such, the output voltage Vout from the operational amplifier 102 more closely matches the voltage at node 109. That is, the output voltage Vout from the operational amplifier 102 equals: the voltage at node 109 ($V_{109}$)+Vos−Vos, i.e., $V_{109}$.

FIG. 8 shows an alternative DAC architecture 200A and FIG. 8A shows sequential steps illustrating the operation of the DAC architecture 200A of FIG. 8. The DAC architecture 200A is identical to the DAC architecture 100A of FIG. 5 except for use of modified two-bit serial charge redistribution DAC 104A described above in connection with FIG. 7A. As noted above, the modified charge redistribution DAC 104A has built-in offset cancellation. Referring now to FIG. 8A, steps 1-11 of FIG. 8A are identical to those described above in connection with FIG. 5A. That is, steps 1-11 are performed to charge capacitor C3 to a desired voltage, which is added to the lower voltage VL. This voltage (VL+$V_{C3}$) is the voltage at node 109 in FIG. 8 after Step 11 is performed. The operation of Step 12 in performing offset cancelation is the same as the operation of step 10 of FIG. 7A described above.

FIG. 9 shows another alternative DAC architecture 200B and FIG. 9A shows sequential steps illustrating the operation of the DAC architecture 200B of FIG. 9. The DAC architecture 200B is identical to the DAC architecture 100B of FIG. 6 except for use of modified two-bit serial charge redistribution DAC 104A described above in connection with FIG. 7A. Referring to FIG. 9A, steps 1-11 of FIG. 9A are identical to those described above in connection with FIG. 6A. That is, steps 1-11 are performed to charge capacitor C3 to a desired voltage, which is added to the lower voltage VL. This voltage (VL+$V_{C3}$) is the voltage at node 111 in FIG. 9 after Step 11 is performed. The operation of Step 12 in performing offset cancelation is the same as the operation of step 10 of FIG. 7A described above.

Figure 12:
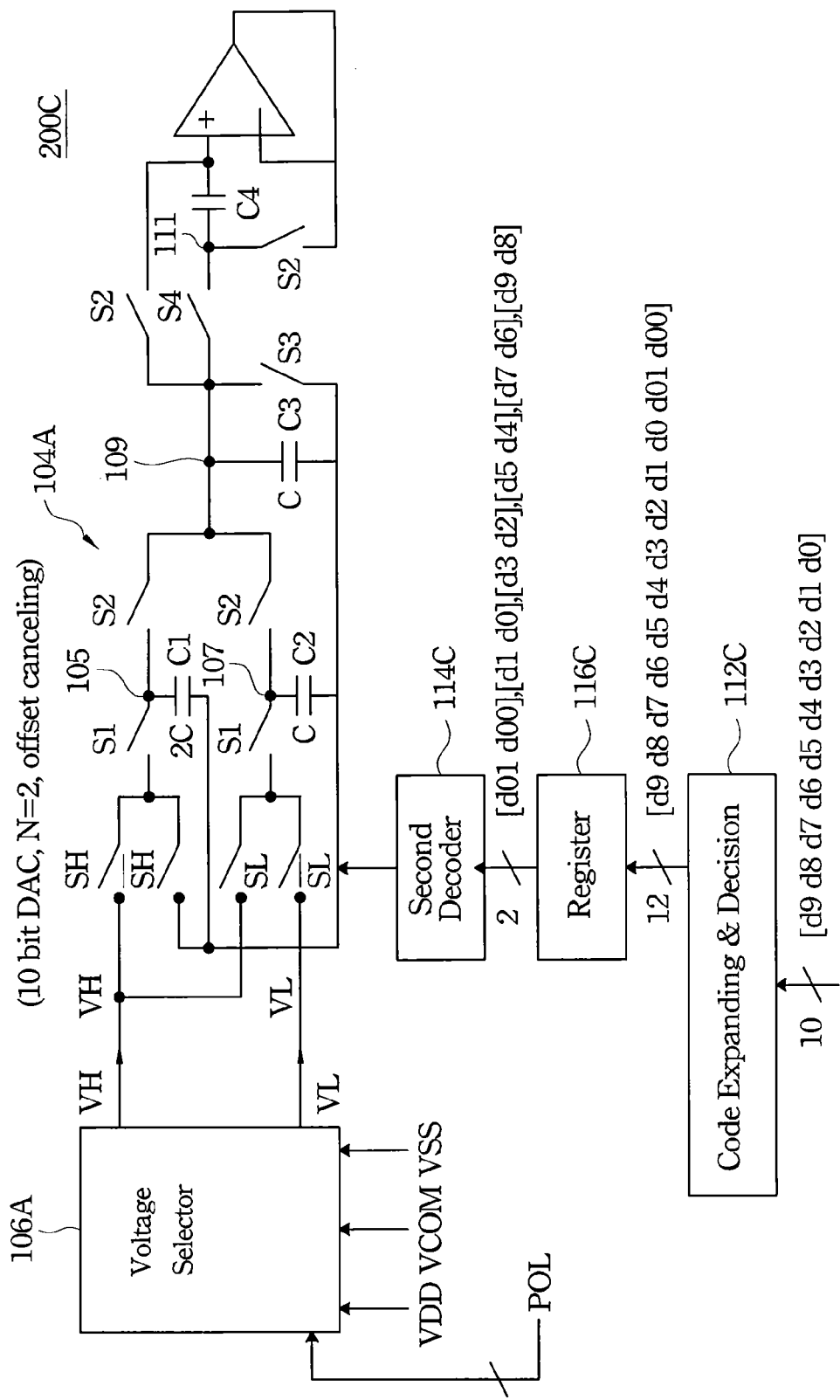
FIG. 12 illustrates an alternative embodiment of a 10-bit DAC architecture of FIG. 8 having a modified reference voltage selector.

FIG. 12 illustrates an alternative DAC architecture 200C, which like architecture 200A of FIG. 8A is a 10-bit DAC with built-in offset canceling and N=2. The DAC architecture 200A is identical to the DAC architecture 200A of FIG. 8A except that decoder 108 and register 110 are eliminated; voltage selector 106 is replaced with modified voltage selector 106A; Code Expanding & Decision logic 112A is replaced with Code Expanding & Decision logic 112C; register 116A is replaced with register 116C; and second decoder 114A is replaced with second decoder 114C.

In this embodiment, VL and VH are each adjustable to one of two different levels via voltage selector 106A. Voltage selector 106A receives as inputs high supply voltage VDD, common mode voltage VCOM, and low power supply voltage VSS, as polarity control signal POL. The voltage selector can be viewed functionally as a one bit decoder for selecting between adjacent voltage pairs VSS/VCOM and VCOM/VDD. Input signal POL to the voltage selector is a polarity signal and can be used to select voltage pair VDD/VCOM (corresponding to a positive polarity signal POL (i.e., POL=1)) or voltage pair VCOM/VSS (corresponding to a negative polarity signal POL (i.e., POL=0)). Signal POL can be generated in any number of ways known to those familiar with differential logic circuits such as timing control circuits.

As with FIG. 8, the 10-bit input code is provided to Code Expanding & Decision logic 112C. The logic 112C expands the 10-bit code by two bits to twelve bits and provides this 12-bit code to register 116C. Register 116C provides the code serially in two increments [dH dL] to the second decoder 114C for control of the two-bit serial charge redistribution DAC 104A. The operation of the serial charge redistribution DAC 104A is identical to that described above in connection with FIG. 8 only no filler bit is required and with use of an additional charge and redistribution steps associated since there are six [dH dL] bit combinations rather than five.

Figure 10:
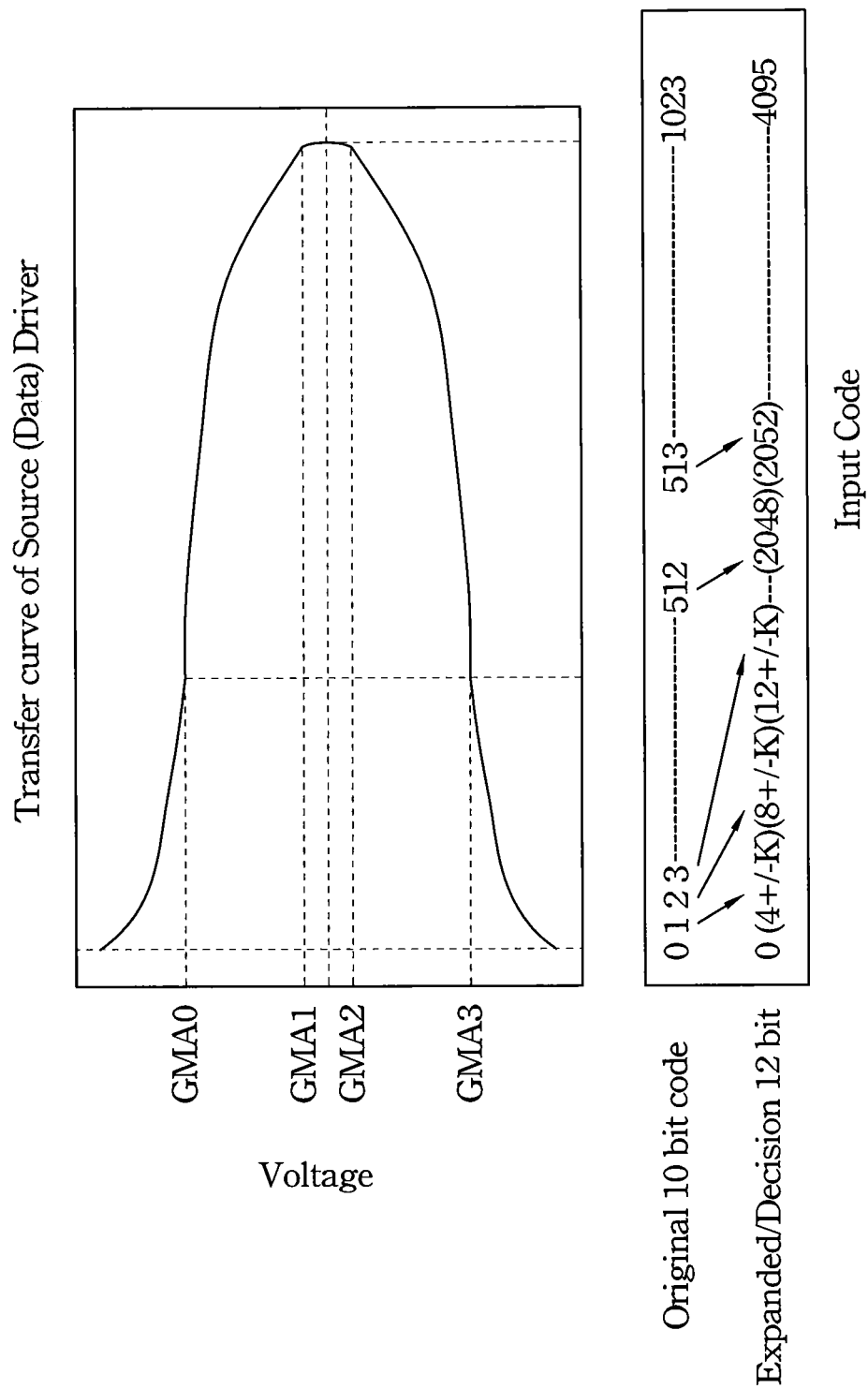
FIG. 10 illustrates a non-linear example of a transfer curve for a source driver.

Further details of the Code Expanding & Decision logic described above are discussed below in connection with FIGS. 10 and 11. As is recognized in the art, a LCD converts a video signal to light in a nonlinear way, because the transfer curve of the liquid crystal display, voltage vs. light transmitting, is nonlinear. The gamma characteristic is a power-law relationship that approximates the relationship between the encoded luma (black/gray/white information) in a video signal and the actual desired image luminance. The LCD display will typically apply some gamma characteristic to the video signal. As such, gamma inversion is applied to the output voltage levels to neutralize the gamma characteristic and provide or approach a linear relationship between encoded luma and the actual image luminance. FIG. 10 illustrates an example of a transfer curve for a source driver. The Y-axis represents the voltage and the X-axis represents the input code. The region from GMA0~GMA1 is positive polarity and GMA2~GMA3 is negative polarity. The curve illustrates that there are regions in the gamma curve where the relationship is linear and regions where the relationship is nonlinear. The Code Expanding & Decision logic described herein expands the original input 10-bit code by N-number of bits (e.g., from 10 bits to 12 bits as shown in the illustration of FIG. 10). The preferred N value is 1, 2 or 3, though the invention is not so limited. The extra N-bit(s) are used to provide for adjustment to the code to account for whether the transition from a given voltage level to the next voltage level is linear or nonlinear. As shown in FIG. 10, by adding two bits the original 10-bit input code for 1 (0000000001) becomes the 12-bit code for 4 (000000000100); the original 10-bit input code for 2 (0000000010) becomes the 12-bit code for 8 (000000001000); the original 10-bit input code for 3 (0000000011) becomes the 12-bit code for 12 (000000001100); etc. In the linear region, a straight code conversion is appropriate, i.e., the 10-bit code for 512 (1000000000) becomes the 12-bit code for 2048 (100000000000). However, in the non-linear region, some adjustment to the code is required to account for the non-linearity. For example, the expanded 12-bit code corresponding to the original 10-bit input code for 1 (0000000001) becomes the 12-bit code for 4 but adjusted by some value +/−K. That is, depending on the value of K, the adjusted expanded code could be: (000000000001) (i.e., K=−3) (000000000010) (i.e., K=−2) (000000000110) (i.e., K=−1); (000000000100) (i.e., K=0); (000000000101) (i.e., K=1); (000000000110) (i.e., K=2); or (000000000111) (i.e., K=3).

The transfer curve shown in FIG. 10 is nonlinear between code 0 and codes 1/2/3, and linear between code 512 and 513. It should be understood that the transfer curve of FIG. 10 is only illustrative of one example of a transfer curve and that individual LCD displays may be associated with respective individual transfer curves.

Figure 11:
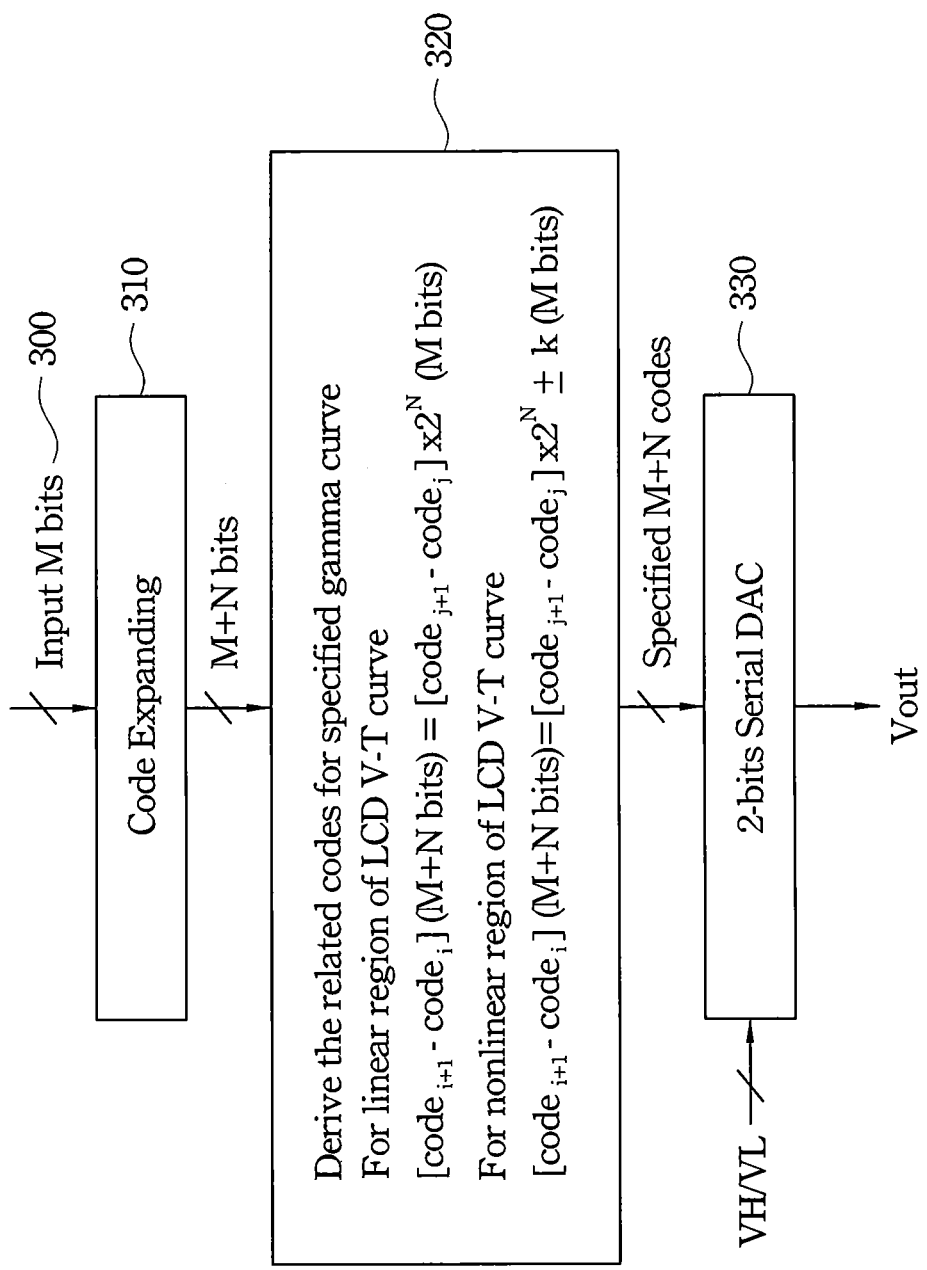
FIG. 11 illustrates the gamma correction operation of an embodiment of a DAC in accordance with the present invention.

The Code Expanding & Decision logic described above is responsible for (1) expanding the input code by N-number of bits (i.e., from 10 to 12 bits), and (2) determining the proper adjustment (by a value K) to the resulting code as appropriate to achieve desired transfer curve. This process as part of a digital-to-analog conversion is illustrated by FIG. 11.

At step 300, the M-bit (e.g., 10-bit) input code is received by the Code Expanding & Decision logic.

At step 310, the Code Expanding & Decision logic expands the code from M bits to M+N total bits.

At step 320, the proper output code is derived for a specified gamma curve. If the code is in the linear region of the LCD voltage-transmittance curve, then [$code_{i+1}$−$code_i$]

(M+N bits)=[code$_{j+1}$−code$_{j}$]×$2^N$ (M bits), where "j" represents a code number in the original code and "i" represents the corresponding code number in the expanded code. In the linear region, the code number difference between the adjacent expanded codes is simply weighted by $2^N$ to the original code. For example, if the curve is linear between the second and third codes for an N=2 embodiment, the second code is 4 and the third code is 8. However, if the code is in the nonlinear regions of the LCD V-T curve, then [code$_{i+1}$−code$_{i}$] (M+N bits)=[code$_{j+i}$−code$_{j}$]×$2^N$±k (M bits). The code number difference between the adjacent expanded codes will have the $2^N$ weighting to the original code but also an adjustment (+/−k) for nonlinear fitting. The adjustment depends on the V-T curve of the LCD and the Code Expanding & Decision logic may utilize a look up table or registers to store the selected proper code and/or the proper offset. It should be understood that "k" is not the same for each expanded code and its value depends on the nonlinear curve.

It should be understood that as part of the code expansion/decision process the non-linear gamma curve can be fitted roughly by the adjustment of selectable voltage pairs V1–V9.

At illustrated by step 330, the outputted M+N-bit code is used by the 2-bit serial DAC portion of the DAC architecture, along with the selected voltage pair (VH/VL), as described above in connection with FIGS. 4-9, to provide the gamma corrected output voltage Vout.

Figure 13:
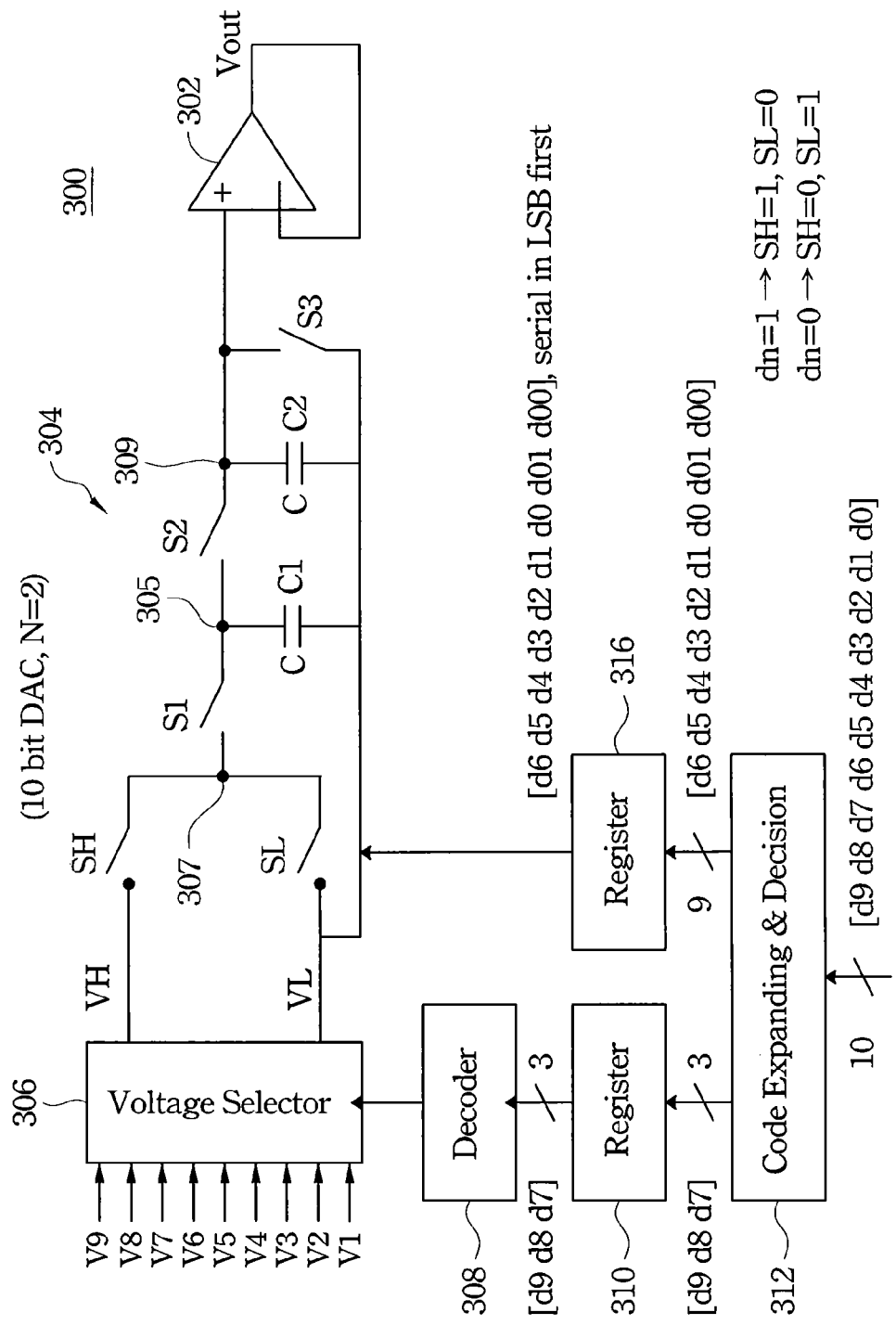

FIG. 13 illustrates an alternative embodiment of a 10-bit DAC architecture 300, which utilizes a one-bit serial charge-redistribution DAC. As with certain ones of the foregoing embodiments, the DAC architecture 300 includes a first voltage pair selection stage. In the illustrated embodiment, the voltage pair selection stage includes a voltage selector 306, decoder 308, register 310 and Code Expanding & Decision logic 312. The operation of these components in selecting an adjacent pair of reference voltages for VH and VL is fully explained in connection with the embodiments illustrated in FIGS. 4, 5, 6, 7, 8 and 9. Alternatively, VH and VL could be set using the voltage selector 106A shown in FIG. 12 and described in connection therewith. In the illustrated embodiment, N is equal to 2, so the Code Expanding & Decision logic 312 outputs nine total bits, including bits d6 to d0 and two additional bits d01 and d00 for implementing gamma expansion and correction as explained above in connection with, for example, the DAC architecture illustrated in FIG. 5. This 9-bit code is provided to a register 316 or other device capable of temporary storage of the code and output of the code in serial fashion to the one-bit serial charge redistribution DAC 304, least significant bit first, one bit at a time (i.e., d00, then d01, then d0, then d1, then d2, then d3, then d4, then d5 and finally d6).

The one-bit serial charge redistribution DAC 304 includes an output operational amplifier 302 having its output feedback coupled to its negative input terminal and its positive input terminal coupled to a charge collection node 309. A first capacitor C1 is coupled between the low reference voltage (VL) node and a first capacitor charging node 305. A termination capacitor C2 is coupled between the VL node and the charge collection node 307. The capacitance of capacitors C1 and C2 are equal to one another. That is, the capacitances are not binary weighted. The operation of the circuit 304 is discussed in more detail in connection with FIG. 13A, which illustrates the sequential steps of the operation of the charge redistribution DAC 304 in producing an output voltage.

The switches SH and SL of the charge redistribution DAC 304 are controlled by the bits dn that are serially provided from register 316. When dn is a "1" the switch SH is closed, and when dn is a "0" the switch SL is closed. High/low voltage node 307 is connected to first capacitor charging node 305 via switch S1, and first capacitor charging node 305 is connected to charge collection node 309 via second switch S2. Switch S2 can be viewed as switch S1 bar since switch S2 is open when S1 is closed and vice versa. When switch S1 is closed (represented by a "1" for S1 in FIG. 13A), switch S2 is open (represented by a "0" for S2 in FIG. 13A). In this state, capacitor C1 is connected to either VH or VL for charging, dependent on the value of dn. When switch S1 is open (represented by a "0" for S1 in FIG. 13A), switch S2 is closed (represented by a "1" for S2 in FIG. 13A. In this state, capacitor C1 is connected in parallel with capacitor C2 for charge redistribution between the two capacitors. Switch S3 is provided between the low voltage node VL and node 309 for resetting the capacitor values.

As shown step-by-step in FIG. 13A, the output voltage is generated through successive alternating charge then redistribution cycles with switches S1 and SH or SL triggered during charging cycles and switch S2 triggered during redistribution cycles.

Turning to FIG. 13A, at Step 1, switch S1 is open, switch S2 is closed, and switch S3 is closed. The bit dn outputted from register 316 is preset to d00. With switch S3 closed, node 309 is set to VL and capacitors C1 and C2 are both coupled between nodes 309 and VL. This connection resets the charge in both capacitors. Switch S3 is open (represented by a "0" in the table of FIG. 13A) in remaining Steps S2 to S19, i.e., until another reset operation is required.

At Step 2, switch S1 is closed, and switch S2 is open. With S1 closed, capacitor C1 is charged in accordance with the value of bit d00. That is, if d00 is a "1" then capacitor C1 is connected to VH, resulting in a charging voltage (VH−VL) across capacitor C1. If d00 is a "0" then there is zero charging voltage (VL−VL) across capacitor C1 and no charge is added to capacitor C1.

At Step 3, switch S1 is open and switch S2 is closed. The bit provided to the serial charge redistribution DAC 304 is preset to the next bit in the one-bit series, i.e., d01. With S2 closed, capacitor C1 is connected in parallel with capacitor C2 between node 309 and low voltage node VL for charge redistribution. Since the total capacitance in this circuit is 2 C (i.e., C1+C2), the total charge in the circuit is distributed (i.e., split) between capacitors C1 and C2. As shown in FIG. 13B, the voltage at node 309 after this step is (d00/2)*(VH−VL)+VL.

At Step 4, switch S1 is closed and switch S2 is open. The bit provided to the serial charge redistribution DAC 304 is d01. With switch S1 closed, capacitor C1 is charged in accordance with the value of d01. The voltage at node 309 remains at (d00/2)*(VH−VL)+VL.

At step 5, switch S1 is again opened and switch S2 is closed. The bit provided to the serial charge redistribution DAC 304 is preset to the next bit in the one-bit series, i.e., d00. Capacitors C1 and C2 are connected in parallel between node 309 and node VL for charge redistribution. The total charge in the circuit (i.e., the charge in capacitor C1 from charging Step 4 and in capacitor C2 from redistribution Step S3) is split between capacitors C1 and C2. As shown in FIG. 13B, the voltage at node 309 after this step is (d01/2+d00/4)*(VH−VL)+VL. As such, the voltage is binary weighted in accordance with the relevant bit positions, i.e., the voltage contribution attributable to d01 is twice that of the contribution attributable to d00.

As should be apparent from the description thus far, the one-bit serial DAC is operated to charge capacitor C1 in accordance with a current bit do and then perform charge redistribution with capacitor C2. This alternating charge then redistribution sequence is performed until the control bit sequence is exhausted and the final redistribution step (Step 19 is performed). The voltage at node 309 after Step 19 is a binary weighted contribution of each bit in the sequential series of control bits, as follows: (d6/2+d5/4+d4/8+d3/16+ d2/32+d1/64+d0/128+d01/256+d00/512)*(VH−VL)+VL. If d00 to d6 are all zeros, then the output voltage from the DAC 300 is VL. If d00 to d6 are all ones, then the output voltage from the DAC 300 is (511/512)*(VH−VL)+VL.

Figure 14:
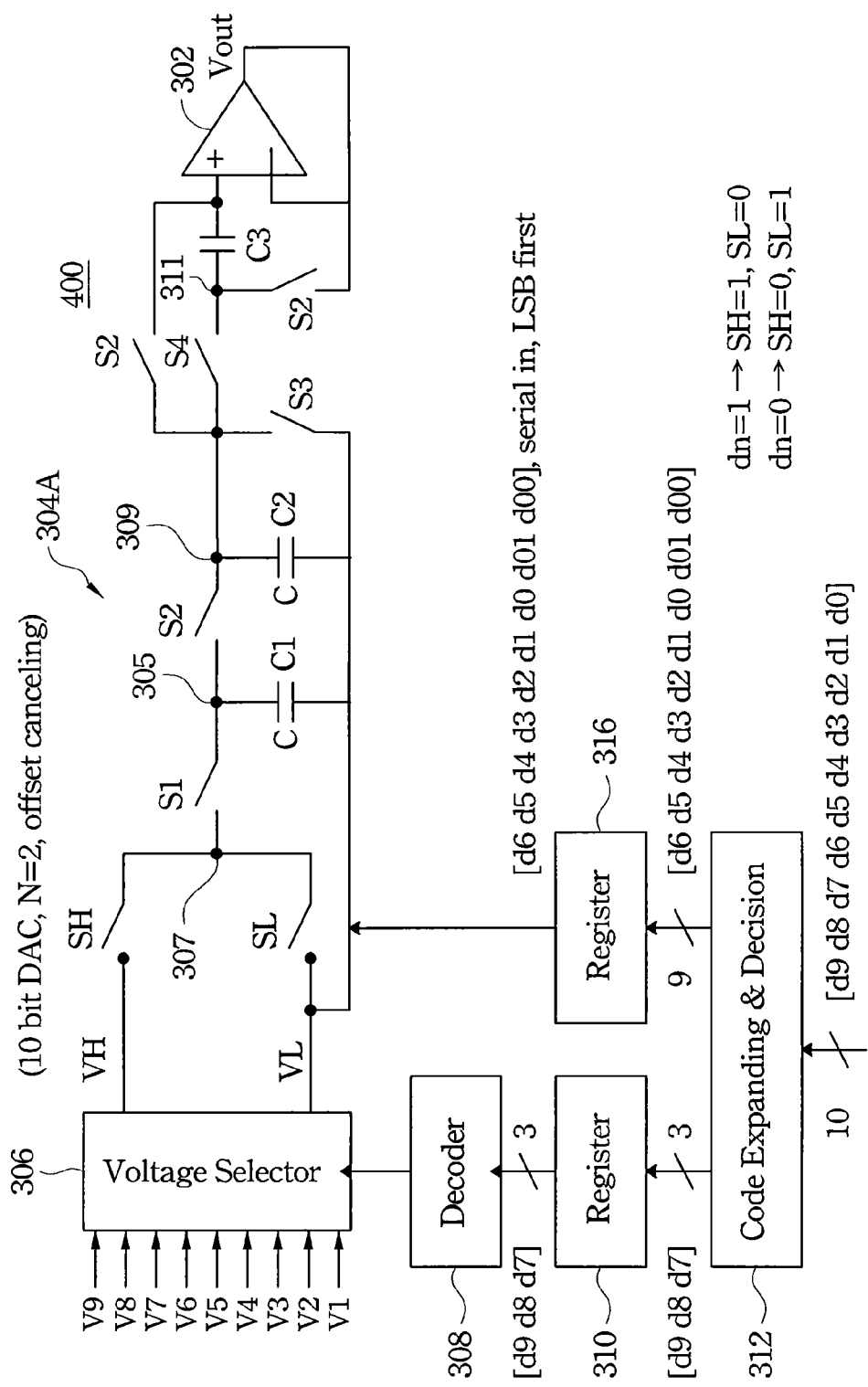

FIG. 14 shows a DAC architecture 400, and FIG. 14A shows sequential steps illustrating the operation of the DAC architecture of FIG. 14. The DAC architecture 400 is identical to the DAC architecture 300 of FIG. 13 except for serial charge-redistribution DAC 304A. Compared to serial charge-redistribution DAC 304, serial charge-redistribution DAC 304A includes: an additional switch S2 coupled between node 309 and the positive input of the operational amplifier 302; an additional switch S2 coupled between the output of the operational amplifier 302 and an intermediate node 311; a switch S4 coupled between nodes 309 and 311; and an offset cancelation capacitor C3 coupled between node 311 and the positive input of the operational amplifier 302. As described above in connection with FIGS. 7, 8 and 9, these additional components operate to compensate for any offset voltage that may be inherent in the operational amplifier 302.

Referring now to FIG. 14A, Steps 1-19 of FIG. 7A are identical to those described above in connection with FIG. 4A. Step 20 is added to perform offset cancelation. Added second switches S2 are closed during the redistribution steps (i.e., odd Steps 3, 5, 9, 11, 13, 15, 17 and 19) and open during the charge steps (i.e., Steps 2, 4, 6, 8, 10, 12, 14, 16 and 18). When switches S2 are closed, capacitor C3 is charged based on the difference between the voltage at node 309 and the output voltage from the operational amplifier 302. This difference represents the offset within the operational amplifier 302. At Step 20, the switches S2 are open and switch S4 is closed, which connects node 309 to the positive input of the operational amplifier 302 through intermediate node 311 and charged capacitor C4. The voltage across capacitor C4 represents the offset level inherent in (or induced by) the operational amplifier 302. This offset voltage is added to the voltage at node 309 to compensate for the offset provided by operational amplifier 302. As such, the output voltage Vout from the operational amplifier 302 more closely matches the voltage at node 309.

While the DAC architecture is illustrated in FIGS. 13 and 14 using an embodiment where N=2, it should be understood that N could be other integer values or even 0. In a preferred embodiment, N is 1, 2 or 3. When compared to the embodiment shown in FIGS. 13 and 14, where N=2, an N=1 embodiment in accordance with this architecture would simply utilize expanded bit sequence [d00 d0 d1 d2 d3 d4 d5 d6], and an N=3 embodiment would simply utilize expanded bit sequence [d00 d01 d02 d0 d1 d2 d3 d4 d5 d6], with the serial charge redistribution DAC 304 or 304A. Moreover, as discussed above, the first stage of the DAC architecture could be replaced with a voltage selector as described in connection with FIG. 12 such that VL and VH are selectively set to either VSS and VCOM, respectively, or to VCOM and VDD, respectively, dependent on the M-bit digital input. Still further, while the DAC architecture is illustrated for a 10-bit DAC, it should be understood that the architecture can be readily scaled to accommodate higher or lower resolutions as needed.

The DAC architectures disclosed herein can significantly reduce the DAC area for high resolution DAC architectures, such as those used in LCD source drivers. For example, it is believed that for a 10-bit DAC architecture, the DAC architecture disclosed herein reduces the DAC area by at least 50% over a 10-bit DAC implemented using a conventional DAC architecture. The DAC architecture is well suited to high speed, large panel, high resolution displays.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A two-stage digital-to-analog converter for outputting an analog voltage in response to a M-bit digital input code, comprising: a one-bit serial charge redistribution digital-to-analog converter having a high reference voltage input node for receiving a high reference voltage and a low reference voltage input node for receiving a low reference voltage, the one-bit serial charge redistribution digital-to-analog converter including: a first capacitor coupled between a first capacitor charging node and the low reference voltage input node; a termination capacitor coupled between a charge collection node and the low reference voltage input node; a first switching circuit for selectively coupling the first capacitor charging node to one of the low reference voltage input node and the high reference voltage input node during first capacitor charge cycles in response to instances of a one-bit control code from a sequence of one-bit control codes derived from the M-bit digital input code; and a second switching circuit for coupling the first capacitor charging node to the charge collection node during charge redistribution cycles that follow the first capacitor charge cycles for charge redistribution with the termination capacitor; and a voltage selector, the voltage selector setting the high reference voltage and low reference voltage to selected levels depending on at least a portion of the M-bit digital input code.

2. The two-stage digital-to-analog converter of claim 1, wherein the first switching circuit includes: a charge cycle switch coupled between the first capacitor charging node and a reference voltage node, the charge cycle switch being configured to be triggered during first capacitor charge cycles; a high reference voltage switch coupled between the reference voltage node and the high reference voltage input node; and a low reference voltage switch coupled between the reference voltage node and the low reference voltage input node, wherein the high and low reference voltage switches are responsive to the one-bit control code.

3. The two-stage digital-to-analog converter of claim 2, wherein the second switching circuit includes a switch coupled between the first capacitor charging node and the charge collection node.

4. The two-stage digital-to-analog converter of claim 1, further comprising an output operational amplifier having a first operational amplifier input coupled to an output of the output operational amplifier and a second operational amplifier input coupled to the charge collection node.

5. The two-stage digital-to-analog converter of claim 4, further comprising a built-in offset cancelation circuit coupled to the output operational amplifier.

6. The two-stage digital-to-analog converter of claim 5, wherein the offset cancelation circuit includes: an offset cancelation capacitor having a first end coupled to the second operational amplifier input and a second end coupled to an intermediate node; a third switching circuit configured to connect the charge collection node to the second operational amplifier input, and the intermediate node to the output of the output operational amplifier, during the first capacitor charge cycles; and a switch configured to connect the intermediate node to the second end of the offset cancelation capacitor during an offset cancelation operation after a final one of the charge redistribution cycles.

7. The two-stage digital-to-analog converter of claim 1, wherein the voltage selector is configured to select for the high and low reference voltages a pair of adjacent reference voltages from a plurality of pairs of adjacent reference voltages.

8. The two-stage digital-to-analog converter of claim 7, wherein the plurality of pairs of adjacent reference voltages includes 8 pairs of adjacent reference voltages, and wherein the voltage selector selects the pair of adjacent reference voltages dependent upon the three most significant bits of the M-bit digital input code.

9. The two-stage digital-to-analog converter of claim 1, wherein the voltage selector is configured to set the low and high reference voltages to a low power supply voltage and to a common mode voltage, respectively, or to the common mode voltage and a high power supply voltage, respectively.

10. The two-stage digital-to-analog converter of claim 1, further comprising gamma correction expansion and decision logic responsive to the M-bit digital input code for implementing gamma correction through code expansion.

11. The two-stage digital-to-analog converter of claim 10, wherein the gamma correction expansion and decision logic expands the M-bit digital input code by one, two or three bits.

12. The two-stage digital-to-analog converter of claim 1, wherein the voltage selector is configured to select for the high and low reference voltages a pair of adjacent reference voltages from a plurality of pairs of adjacent reference voltages, wherein the plurality of pairs of adjacent reference voltages includes Y pairs of adjacent reference voltages, and wherein the voltage selector selects the pair of adjacent reference voltages dependent upon the X-most significant bits of the M-bit digital input code, where X is equal to $\log_2 Y$, wherein the two-stage digital-to-analog converter further comprises: logic for selecting the X-most significant bits of the M-bit digital input code; an X-bit decoder, the decoder decoding the selected X-most significant bits for controlling the voltage selector; and logic for selecting the Z-least significant bits of the M-bit digital input code, where Z is equal to M-X; a register for temporarily storing at least the Z-least significant bits and serially providing one-bit control codes derived from at least the Z-least significant bits for the one-bit serial charge redistribution digital-to-analog converter.

13. The two-stage digital-to-analog converter of claim 12, wherein M is equal to 10 and X is equal to 3.

14. The two-stage digital-to-analog converter of claim 12, further comprising code expansion and decision logic, including said logic for selecting the Z-least significant bits, responsive to the M-bit digital input code for implementing gamma correction through code expansion.

15. The two-stage digital-to-analog converter of claim 14, wherein the gamma correction expansion and decision logic expands the M-bit digital input code by one, two or three bits.

16. The two-stage digital-to-analog converter of claim 1, further comprising a reset switch coupled between the low reference voltage input node and the charge collection node.

17. A liquid crystal display (LCD) source driver including: a two-stage digital-to-analog converter for outputting an analog voltage in response to a M-bit digital input code, the two-stage digital-to-analog converter comprising: a one-bit serial charge redistribution digital-to-analog converter having a high reference voltage input node for receiving a high reference voltage and a low reference voltage input node for receiving a low reference voltage, the one-bit serial charge redistribution digital-to-analog converter including: a first capacitor coupled between a first capacitor charging node and the low reference voltage input node; a termination capacitor coupled between a charge collection node and the low reference voltage input node; a first switching circuit for selectively coupling the first capacitor charging node to one of the low reference voltage input node and the high reference voltage input node during first capacitor charge cycles in response to instances of a one-bit control code from a sequence of one-bit control codes derived from the M-bit digital input code; and a second switching circuit for coupling the first capacitor charging node to the charge collection node during charge redistribution cycles that follow the first capacitor charge cycles for charge redistribution with the termination capacitor; and a voltage selector, the voltage selector setting the high reference voltage and low reference voltage to selected levels depending on at least a portion of the M-bit digital input code; and gamma correction expansion and decision logic responsive to the M-bit digital input code for implementing gamma correction through code expansion.

18. The LCD source driver of claim 17, further comprising: an output operational amplifier having a first operational amplifier input coupled to an output of the output operational amplifier and a second operational amplifier input coupled to the charge collection node; and a built-in offset cancelation circuit coupled to the output operational amplifier.

19. The LCD source driver of claim 17, wherein the gamma correction expansion and decision logic expands the M-bit digital input code by one, two or three bits into an expanded code.

20. The LCD source driver of claim 19, wherein the sequence of one-bit control codes is provided serially from the expanded code, least significant bit first.

* * * * *